United States Patent
Seo et al.

(10) Patent No.: US 7,332,857 B2
(45) Date of Patent: Feb. 19, 2008

(54) LIGHT EMITTING DEVICE AND MANUFACTURING METHOD THEREOF

(75) Inventors: Satoshi Seo, Kanagawa (JP); Shunpei Yamazaki, Tokyo (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 0 days.

(21) Appl. No.: 10/043,812

(22) Filed: Jan. 10, 2002

(65) Prior Publication Data

US 2002/0109136 A1    Aug. 15, 2002

(30) Foreign Application Priority Data

Jan. 18, 2001   (JP)   ............... 2001-010887

(51) Int. Cl.
   *H05B 33/00*   (2006.01)
(52) U.S. Cl. .............. 313/504; 313/506; 428/917
(58) Field of Classification Search .......... 313/504, 313/506, 503; 428/690, 917
   See application file for complete search history.

(56) References Cited

U.S. PATENT DOCUMENTS

| | | | |
|---|---|---|---|
| 3,654,525 A | | 4/1972 | Maricle et al. |
| 5,017,863 A | | 5/1991 | Mellitz |
| 5,039,657 A | | 8/1991 | Goldman et al. |
| 5,170,990 A | | 12/1992 | Kamiya et al. |
| 5,256,945 A | | 10/1993 | Imai et al. |
| 5,271,089 A | | 12/1993 | Ozawa |
| 5,281,489 A | | 1/1994 | Mori et al. |
| 5,486,406 A | | 1/1996 | Shi |
| 5,513,499 A | | 5/1996 | deRijke |
| 5,674,597 A | * | 10/1997 | Fujii et al. ............ 428/212 |
| 5,719,467 A | | 2/1998 | Antoniadis et al. |
| 5,817,431 A | | 10/1998 | Shi et al. |
| 5,853,905 A | | 12/1998 | So et al. |
| 5,858,563 A | | 1/1999 | Sano et al. |
| 5,925,472 A | | 7/1999 | Hu et al. |
| 5,925,980 A | * | 7/1999 | So et al. ............ 313/504 |
| 5,955,836 A | | 9/1999 | Boerner et al. |
| 5,989,737 A | | 11/1999 | Xie et al. |
| 6,030,715 A | | 2/2000 | Thompson et al. |

(Continued)

FOREIGN PATENT DOCUMENTS

EP      1 011 155      6/2000

(Continued)

OTHER PUBLICATIONS

Tang et al. "Organic electroluminescent diodes." Applied Physics Letters 51(12): 1987. p. 913-915.

(Continued)

*Primary Examiner*—Ashok Patel
(74) *Attorney, Agent, or Firm*—Fish & Richardson P.C.

(57) ABSTRACT

A region in which the concentration of a first organic compound and the concentration of a second organic compound change gradually (namely, a concentration change region 204b) exists within an organic compound film, and therefore a clear organic boundary does not exist. However, a region in which the first organic compound is capable of expressing its function (a first functional region) and a region in which the second organic compound is capable of expressing its function (a second functional region) exist, and therefore the function of each material can be expressed.

24 Claims, 23 Drawing Sheets

U.S. PATENT DOCUMENTS

| | | | |
|---|---|---|---|
| 6,097,147 A | 8/2000 | Baldo et al. | |
| 6,121,727 A | 9/2000 | Kanai et al. | |
| 6,130,001 A * | 10/2000 | Shi et al. | 428/690 |
| 6,132,280 A | 10/2000 | Tanabe et al. | |
| 6,215,462 B1 | 4/2001 | Yamada et al. | |
| 6,228,228 B1 | 5/2001 | Singh et al. | |
| 6,237,529 B1 | 5/2001 | Spahn | |
| 6,275,649 B1 | 8/2001 | Nagashima et al. | |
| 6,284,050 B1 | 9/2001 | Shi et al. | |
| 6,285,039 B1 | 9/2001 | Kobori et al. | |
| 6,303,239 B1 * | 10/2001 | Arai et al. | 428/690 |
| 6,310,360 B1 | 10/2001 | Forrest et al. | |
| 6,326,091 B1 * | 12/2001 | Schoo et al. | 428/690 |
| 6,368,730 B1 * | 4/2002 | Kishimoto et al. | 428/690 |
| 6,372,154 B1 | 4/2002 | Li | |
| 6,392,250 B1 | 5/2002 | Aziz et al. | |
| 6,392,339 B1 | 5/2002 | Aziz et al. | |
| 6,396,209 B1 | 5/2002 | Kido et al. | |
| 6,413,656 B1 | 7/2002 | Thompson et al. | |
| 6,432,255 B1 | 8/2002 | Sun et al. | |
| 6,458,475 B1 * | 10/2002 | Adachi et al. | 428/690 |
| 6,468,676 B1 | 10/2002 | Ueda et al. | |
| 6,495,198 B2 | 12/2002 | Peng | |
| 6,501,217 B2 * | 12/2002 | Beierlein et al. | 313/504 |
| 6,517,996 B1 | 2/2003 | Chao et al. | |
| 6,528,824 B2 | 3/2003 | Yamagata et al. | |
| 6,541,909 B1 | 4/2003 | Motomatsu | |
| 6,558,817 B1 | 5/2003 | Ueda et al. | |
| 6,559,065 B2 | 5/2003 | Kawashima | |
| 6,566,807 B1 | 5/2003 | Fujita et al. | |
| 6,603,140 B2 | 8/2003 | Kobori et al. | |
| 6,614,175 B2 | 9/2003 | Aziz et al. | |
| 6,682,782 B2 | 1/2004 | Jung et al. | |
| 6,759,144 B2 | 7/2004 | Toguchi et al. | |
| 6,803,720 B2 * | 10/2004 | Kwong et al. | 313/504 |
| 6,831,406 B1 | 12/2004 | Fukuyama et al. | |
| 2001/0043044 A1 * | 11/2001 | Wakimoto et al. | 313/506 |
| 2002/0018912 A1 | 2/2002 | Jung et al. | |
| 2002/0038867 A1 | 4/2002 | Kobori et al. | |
| 2002/0074935 A1 | 6/2002 | Kwong et al. | |
| 2002/0081767 A1 | 6/2002 | Kawashima | |
| 2002/0086180 A1 * | 7/2002 | Seo et al. | 428/690 |
| 2003/0118950 A1 | 6/2003 | Chao et al. | |
| 2003/0134145 A1 | 7/2003 | Toguchi et al. | |

FOREIGN PATENT DOCUMENTS

| | | |
|---|---|---|
| EP | 1 065 737 | 1/2001 |
| EP | 1 220 340 | 7/2002 |
| JP | 03-114197 | 5/1991 |
| JP | 10-233288 | 9/1998 |
| JP | 2000-208262 | 7/2000 |
| JP | 2001-023776 | 1/2001 |
| JP | 2001-52870 | 2/2001 |
| TW | 243470 | 3/1995 |
| TW | 366598 | 8/1999 |
| TW | 451601 | 8/2001 |
| WO | WO98-08360 | 2/1998 |
| WO | WO02-47457 | 6/2002 |

OTHER PUBLICATIONS

Kijima et al. "A blue organic light emitting diode." Jpn. J. Appl. Phys. 38: 1999, p. 5274-5277.

C. Adachi et al. "Electroluminescence in organic films with three-layer structure." Jpn. J. Appl. Phys. 27(2): 1988. p. L269-L271.

C.W. Tang et al. "Electroluminescence of doped organic thin films." J. Appl. Phys. 65(9): 1989. p. 3610-3616.

"New Aspect of Research and Development of Organic EL." M&BE Seminar, Bulletin of Organic Molecular/Bioelectronics Subcommittee, Society of Applied Physics, 11(1): 2000. p. 3-12.

T. Wakimoto et al. "Organic EL cells using alkaline metal compounds as electron injection materials." IEEE Transactions on Electron Devices 44(8): 1997. p. 1245-1248.

S.A. Van Slyke et al. "Organic electroluminescent devices with improved stability." Appl. Phys. Lett. 69(15): 1996. p. 2160-2162.

D.F. O'Brien et al. "Improved energy transfer in electrophosphorescent devices." Appl. Phys. Lett. 74(3): 1999. p. 442-444.

T. Tsutsui et al. "High quantum efficiency in organic light-emitting devices with iridium-complex as a triplet emissive center." Jpn. J. Appl. Phys. 38: 1999. p. L1502-L1504.

T. Tsutsui et al. "The operation mechanism and the light emission efficiency of the organic EL element." Text of the Third Lecture Meeting, Bulletin of Organic Molecular/Bioelectronics Subcommittee, Society of Applied Physics, p. 31-37.

J. Kido et al. "Multilayer white light-emitting organic electroluminescent device." Science 367: 1995. p. 1332-1334.

Satoshi Seo et al., U.S. Appl. No. 10/043,786, filed Jan. 10, 2002.

Satoshi Seo et al., U.S. Appl. No. 10/060,427, filed Jan. 29, 2002.

Shunpei Yamazaki et al., U.S. Appl. No. 10/062,005, filed Jan. 31, 2002.

Satoshi Seo et al., U.S. Appl. No. 10/072,507, filed Feb. 5, 2002.

Shunpei Yamazaki et al., U.S. Appl. No. 10/072,310, filed Feb. 5, 2002.

Shunpei Yamazaki et al., U.S. Appl. No. 10/081,971, filed Feb. 20, 2002.

Satoshi Seo et al., U.S. Appl. No. 10/081,558, filed Feb. 20, 2002.

Hirokazu Yamagata et al., U.S. Appl. No. 09/852,090, filed May 10, 2001.

Satoshi Seo et al., U.S. Appl. No. 10/026,064, filed Dec. 21, 2001.

Satoshi Seo et al., U.S. Appl. No. 10/024,699, filed Dec. 21, 2001.

J. Kido et al. "Multilayer white light-emitting organic electroluminescent device." Science 267: 1995. p. 1332-1334.

Australian Patent Office Search Report (SC 200200365-5), dated Nov. 11, 2003, 11 pages.

Australian Patent Office Search Report (SG 200200037-0), dated Oct. 7, 2003, 8 pages.

Takeshi Nishi et al.; "High Efficiency TFT-OLED Display with Iridium-Complex As Triplet Emissive Center"; *Proceedings of the 10th International Workshop on Inorganic and Organic Electroluminescence (EL '00)*; pp. 353-356; Dec. 4-7, 2000.

Baldo et al., "Very High-Efficiency Green Organic Light-Emitting Devices Based on Electrophosphorescence," *Applied Physics Letters*, vol. 75, No. 1, pp. 4-6, Jul. 5, 1999.

* cited by examiner

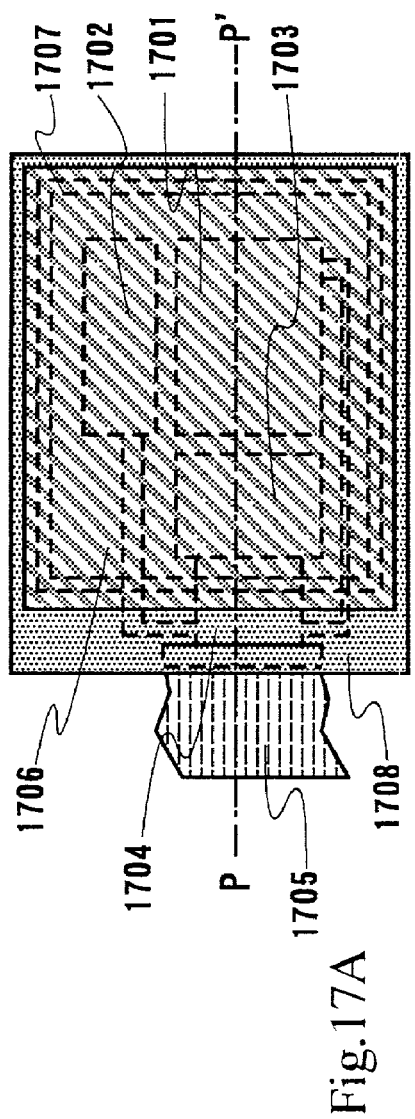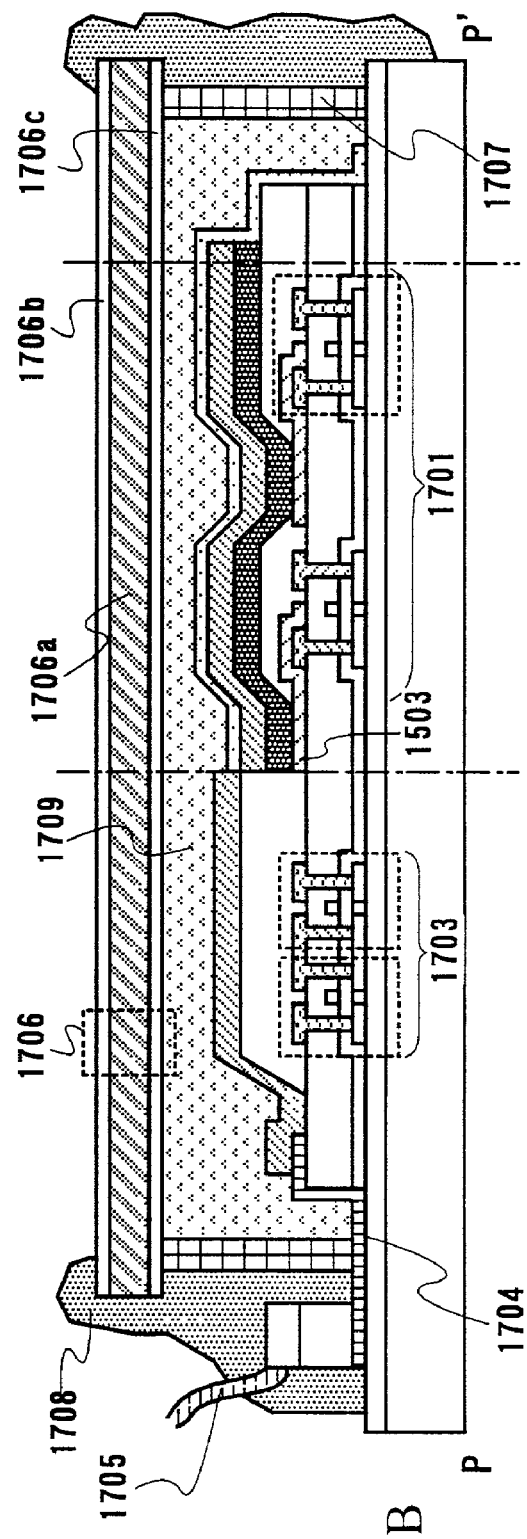
Fig.17A
Fig.17B

1 Frame

SF1-SF6: sub-frame, $T_A$: write in time

LIGHT EMITTING DEVICE AND MANUFACTURING METHOD THEREOF

BACKGROUND OF THE INVENTION

1. Field of the Invention

The invention relates to a light emitting device using an organic light emitting element having an anode, a cathode, and a film (referred below to as "organic compound film"), which includes an organic compound adapted to effect luminescence upon application of an electric field. In particular, the invention relates to a light emitting device using an organic light emitting element, which is lower in drive voltage and longer in service life than a prior one. In addition, the light emitting device described in the specification of the present application indicates an image display device or a light emitting device, which use an organic light emitting element as light emitting element. Also, the light emitting device includes all of modules, in which a connector, for example, an anisotropic electro conductive film (FPC:Flexible printed circuit) or a TAB (Tape Automated Bonding) tape or a TCP (Tape Carrier Package) is mounted to an organic light emitting element, modules, in which a printed-circuit board is provided on a TAB tape or a tip end of a TCP, or modules, in which an IC (integrated circuit) is directly mounted on an organic light emitting element in the COG (Chip On Glass) system.

2. Described of the Related Art

An organic light emitting element is one adapted to effect luminescence upon application of an electric field. A mechanism for luminescence has been said to reside in that an organic compound film is interposed between electrodes, upon application of voltage thereto electrons filled from a cathode and positive holes filled from an anode recombine together at a center of luminescence in the organic compound film to form excited molecules, and the molecule excitons discharge energy to produce luminescence when returned to the base state.

In addition, kinds of molecule excitons formed by the organic compound can include a singlet excited state and a triplet excited state, while the specification of the present invention contains the case where either of the excited states contributes to luminescence.

In such organic light emitting element, an organic compound film is normally formed in a thin film below 1 μm. Also, since the organic light emitting element is a self-luminescent type one, in which the organic compound film itself emits light, a backlight used in a conventional liquid crystal display is not necessary. Accordingly, the organic light emitting element can be very advantageously formed to be thin and lightweight.

Also, with, for example, an organic compound film of about 100 to 200 nm in thickness, a time period having elapsed from filling of a carrier to recombination thereof is in the order of several tens of nanosecond taking account of the extent of movement of the carrier in the organic compound film, and luminescence is achieved in the order of less than one micro second even when the a procedure from the recombination of the carrier to luminescence is included. Accordingly, one of the features is that the speed of response is very large.

Further, since the organic light emitting element is a carrier-filling type light emitting element, it can be driven by DC voltage, and is hard to generate noise. With respect to drive voltage, an adequate luminance of 100 cd/m$^2$ is achieved at 5.5 V by first making the thickness of an organic compound film a uniform, super-thin film of around 100 nm, selecting an electrode material, which reduces a carrier filling barrier relative to the organic compound film, and further introducing a single hetero structure (double structure) (Reference 1: C. W. Tang and S. A. VanSlyke, "Organic electroluminescent diodes", Applied Physics Letters, vol. 51, No. 12, 913-915 (1987)).

Owing to such performances as thin and lightweight, high-speed responsibility, DC low voltage drive, and the like, organic light emitting elements have been given attention as next-generation flat panel display elements. Also, since organic light emitting elements are of self-luminescent type and large in angle of visibility, they are comparatively favorable in visibility and believed to be effective as elements used for displays in portable equipments.

Hereupon, in the constitution of an organic light emitting element described in Reference 1, a carrier filling barrier is made small relative to an organic compound film by using as a cathode a relatively stable Mg:Ag alloy of low work function to enhance an electron filling quality. This makes it possible to fill a large amount of carrier into the organic compound film.

Further, the recombination efficiency of the carrier is improved by leaps and bounds by application of a single hetero structure, in which a positive hole carrying layer composed of a diamine compound and an electron carrying luminescent layer composed of tris (8-quinolinolato) aluminum (abbreviation; Alq$_3$) are laminated as an organic compound film, which is explained below.

In the case of, for example, an organic light emitting element having only a single Alq$_3$ layer, a major part of electrons filled from a cathode reaches an anode without recombining with positive holes, making the luminescent efficiency very low, since Alq$_3$ is of electron carrying quality. That is, in order to have the single layered organic light emitting element efficiently emitting light (or driving at low voltage), it is necessary to use a material (referred below to as "bipolar material") capable of carrying both electrons and positive holes in well-balanced manner, and Alq$_3$ does not meet such requirement.

However, application of the single hetero structure described in Reference 1 causes electrons filled from a cathode to be blocked by an interface between the positive hole carrying layer and the electron carrying luminescent layer to be enclosed in the electron carrying luminescent layer. Accordingly, the carrier is efficiently recombined in the electron carrying luminescent layer to provide for efficient luminescence.

When the concept of such carrier blocking function is developed, it becomes possible to control a carrier recombining region. As an example, there is a report, according to which success is achieved in enclosing positive holes in a positive hole carrying layer and making the positive hole carrying layer luminescent by inserting a layer (positive hole blocking layer), which is capable of blocking positive holes, between the positive hole carrying layer and an electron carrying layer (Reference 2: Yasunori KIJIMA, Nobutoshi ASAI and Shin-ichiro TAMURA, "A Blue Organic Light Emitting Diode", Japanese Journal of Applied Physics, Vol. 38, 5274-5277 (1999)).

Also, it can be said that the organic light emitting element described in Reference 1 is based on, so to speak, that thought of functional separation, according to which carrying of positive holes is performed by the positive hole carrying layer and carrying and luminescence of electrons are performed by the electron carrying luminescent layer. Such concept of functional separation has further grown to a concept of double heterostructure (three-layered structure), according to which a luminescent layer is inserted between the positive hole carrying layer and the electron carrying layer (Reference 3: Chihaya ADACHI, Shizuo TOKITO, Tetsuo TSUTSUI and Shogo SAITO. "Eectroluminescence in Organic Films with Three-Layered Structure", Japanese Journal of Applied Physics, Vol. 27, No. 2, L269-L271 (1988)).

Such functional separation has an advantage in that the functional separation makes it unnecessary for a kind of organic material to have a variety of functions (luminescence, carrier carrying quality, filling quality of carrier from electrode, and so on) at a time, which provides a wide freedom in molecular design or the like (for example, it is unnecessary to unreasonably search for bipolar materials). That is, a high luminous efficiency can be easily attained by combining materials having a good luminous quality and a carrier carrying quality, respectively.

Owing to these advantages, the concept of the laminated structure (carrier blocking function or functional separation) itself described in Reference 1 has been widely utilized till now.

However, an energy barrier always develops in the interface because there is contact between different types of substances in the aforementioned lamination structure. Movement of carriers in the interface is prevented if the energy barrier exists, and this raises the two problems discussed below.

First, one problem is that there arise difficulties in further reducing the driver voltage. In fact, it has been reported for current organic light emitting elements that single layer structure elements using a conjugate polymer are superior with regard to driver voltage, and that top data in power efficiency (unit of 1 m/W) is maintained (when light emission from a singlet excitation state is compared) (Reference 4: Tetsuo Tsutsui, "Applied Physics Society Organic Molecules—Bioelectronics Section," Vol. 11, No. 1, p. 8 (2000).

Note that the conjugate polymers discussed in reference 4 are bipolar materials, and that a level of carrier recombination efficiency equivalent to that of a lamination structure can be achieved. A single layer structure with few interfaces therefore in practice shows a lower driver voltage provided that the carrier recombination efficiency can be made equivalent by a method such as using a bipolar material without the use of a lamination structure.

For example, a method exists in which a material for relieving the energy barrier is inserted in the interface with the electrode to increase the carrier injecting properties and reduce the driver voltage (Reference 5: Takeo Wakimoto, Yoshinori Fukuda, Kenichi Nagayama. Akira Yokoi, Hitoshi Nakada, and Masami Tsuchida, "Organic EL Cells Using Alkaline Metal Compounds as Electron Injection Materials", IEEE TRANSACTIONS ON ELECTRON DEVICES, VOL. 44, NO. 8, 1245-1248 (1997)). The driver voltage is successfully reduced by using $Li_2O$ as an electron injecting layer in reference 5.

However, carrier mobility between organic materials (for example, between a hole transporting layer and a light emitting layer, hereafter denoted by the term "organic interface") is a field which is not yet resolved, and is considered to be a vital point in order to reach the low driver voltage of a single layer structure.

In addition, the other problem caused by the energy barrier is considered to be an influence on the element lifetime of the organic light emitting element. Namely, brightness drops because the carrier movement is impeded and charges accumulate.

No definite theory has been established regarding the mechanism of this degradation. However, it has been reported that the drop in brightness can be suppressed by inserting a hole injecting layer between the anode and the hole transporting layer, and in addition, by performing ac drive at a short wavelength instead of dc drive (Reference 6: S. A. VanSlyke, C. H. Chen, and C. W. Tang, "Organic electroluminescent devices with improved stability," Applied Physics Letters, Vol. 69, No. 15, 2160-2162 (1996)). This can be said to be experimental evidence that the reduction in brightness can be suppressed in accordance with eliminating charge accumulation by adding the hole injecting layer and by using ac drive.

From the above discussion, the lamination structure has the merits of being able to easily increase the carrier recombination efficiency, and being able to increase the breadth of selection of materials from the vantage of separating functions. However, carrier mobility is suppressed due to the formation of many organic boundaries, and this in turn influences drops in the driver voltage and in brightness.

SUMMARY OF THE INVENTION

An object of the present invention is to relieve the energy barrier existing within organic compound films for increasing carrier mobility, and at the same time to generate the function of each of a plurality of various materials, similarly to the separation of functions in the lamination structure (and hereafter referred to as "function expression"), by manufacturing an element with a concept that differs from lamination structures conventionally in use. Accordingly, another object of the present invention is to provide an organic light emitting element with a longer element lifetime as well as a lower driver voltage, compared to conventional light emitting elements.

Further, an object of the present invention is to provide a light emitting device with a longer lifetime and a lower driver voltage, compared to conventional light emitting devices, by using the organic light emitting element. In addition, an object of the present invention is to provide electronic equipment with a longer life at lower electric power consumption, compared to conventional electronic equipment, by manufacturing the electronic equipment using the light emitting device.

The technique of inserting a carrier injecting layer such as that seen in reference 5 is conspicuous for relieving the energy barrier in a lamination structure. A hole injecting layer is taken as an example, and an explanation using an energy band diagram is shown in FIG. 1A.

An anode 101 and a hole transporting layer 102 are in direct contact in FIG. 1A, and in this case, an energy barrier 104 between the anode 101 and the hole transporting layer 102 is large. However, the energy barrier can be designed in a stairstep shape by inserting as a hole injecting layer 103 a material with a highest occupied molecular orbital (hereafter referred to as HOMO) level at intermediate position between the ionic potential of the anode and the HOMO of the hole transporting layer (see FIG. 1B.)

Carrier injection from electrodes can be increased and the driver voltage can indeed be reduced to a certain degree, by designing a stairstep shape energy barrier as shown in FIG. 1B. However, there is a problem that the number of organic boundaries increases by increasing the number of layers. This can be considered as a cause for the single layer structure being able to maintain top data in its driver voltage and power efficiency, as shown reference 4.

In other words, by overcoming this problem, the merits of the lamination structure (various materials can be combined, and a complex molecular design is not necessary) can continue to be utilized and the driver voltage and power efficiency of the single layer structure can be achieved.

The applicants of the present invention thus propose a method of essentially eliminating the interfaces and relieving the energy barriers within an organic compound film containing two or more organic compounds which are capable of undergoing vacuum evaporation.

Namely, a method of essentially eliminating boundaries within an organic compound film by forming a region in which at least two compounds are mixed (hereafter referred to as a "mixed region") for cases in which the two compounds are capable of undergoing vacuum evaporation and are selected from the group consisting of: hole injecting compounds that receive holes from an anode; hole transporting compounds with a hole mobility that is larger than their electron mobility; electron transporting compounds with an electron mobility that is larger than their hole mobility; electron injecting compounds that receive electrons from a cathode; and blocking compounds capable of preventing hole or electron movement. This method is hereafter referred to as "mixed junction."

A method of doping a guest into a mixed region can be considered as cases of forming this type of mixed junction. It is preferable to use a light emitting compound that emits light as the guest since carrier movement is considered to be facilitated in the mixed region.

An organic light emitting element capable of the function expression without showing a clear lamination structure (in other words, there are no clear organic boundaries) can thus be manufactured by implementing mixed junction as discussed above.

Further, a method of forming a region in an organic compound film containing a first organic compound and a second organic compound which is different from the first organic compound, in which the first organic compound and the second organic compound are mixed, and in which the concentration of the first organic compound and the concentration of the second organic compound change (hereafter referred to as a "concentration change region") is suitable for the present invention. Namely, this is a concept of adding concentration change to the mixed region. In addition, it is more preferable that the concentration change in the concentration change region be continuous. This method is hereafter referred to as "continuous junction."

A conventional lamination structure and a conceptual diagram of the continuous junction according to the present invention are shown in FIGS. 2A and 2B, respectively. FIG. 2A is a conventional lamination structure diagram (single hetero structure). Namely, there is an organic compound film 203a formed of a first organic compound 201 and a second organic compound 202, and a lamination structure formed from a first organic compound layer 201a and from a second organic compound layer 202a exists (alternatively, it can be said that a clear organic boundary exists). A region in which the concentration of the first organic compound 201 and the concentration of the second organic compound 202 change gradually does not exist in this case, it can be seen that there is discontinuity (namely, the concentration changes from 0% to 100%. or from 100% to 0%. in the organic boundary).

However, a region in which the concentration of the first organic compound 201 and the concentration of the second organic compound 202 change gradually (namely, a concentration change region 204b) exists within the organic compound film 203b in the case of the present invention (FIG. 2B), and therefore a clear organic boundary does not exist. However, a region in which the first organic compound is capable of expressing its function (a first functional region 201b) and a region in which the second organic compound is capable of expressing its function (a second functional region 202b) exist, and therefore the function of each material can be expressed. Note that continuous junction in which the concentration changes are continuous is shown in particular in FIG. 2B.

An organic light emitting element capable of the function expression without showing a clear lamination structure (in other words, there are no clear organic boundaries) can be manufactured by implementing continuous junction as discussed above.

Note that, it is preferable that the first organic compound and the second organic compound contained in the concentration change region have different functions from the standpoint of the concept of the present invention (namely, that the function of each of a plurality of various materials express without using a conventional lamination structure).

Accordingly, cases in which the first organic compound and the second organic compound have different properties, selected from the group consisting of: hole injecting property of receiving holes from the anode; hole transporting property that hole mobility is larger than electron mobility; electron transporting property that electron mobility is larger than hole mobility; electron injecting property of receiving electrons from the cathode; blocking property of preventing hole or electron movement; and light emitting property of emitting light, are included in the present invention.

In particular, it is a preferable method from the standpoint of carrier balance to use the hole transporting property for the first organic compound and the electron transporting property for the second organic compound, and to form continuous junction so that the concentration of the first organic compound decreases and the concentration of the second organic compound increases in a direction from the anode to the cathode.

Further, provided that the second organic compound has the light emitting property and that the first organic compound has the hole transporting property in the concentration change region, it is preferable that a concentration change region be formed, in which the concentration of the first organic compound decreases and the concentration of the second organic compound increases in a direction from the anode to the cathode (so as to increase the concentration of the hole transporting property material at the anode side in the concentration change region).

Conversely, provided that the first organic compound has the light emitting property and that the second organic compound has the electron transporting property in the concentration change region, it is preferable that a concentration change region be formed, in which the concentration of the first organic compound decreases and the concentration of the second organic compound increases in a direction from the anode to the cathode (so as to increase the concentration of the electron transporting property material at the cathode side in the concentration change region).

Note that it is preferable to use aromatic diamine compounds with high a hole transporting property as the first organic compound. In particular, compounds shown by: 4,4'-bis[N-(3-methylphenyl)-N-phenylamino]-biphenyl; 4,4'-bis[N-(1-naphthyl)-N-phenylamino]-biphenyl; and 4,4',4"-tris[N-(3-methylphenyl)-N-phenylamino]-triphenylamine are mainly used. Furthermore, it is preferable to use a metal complex containing a benzo-quinoline skeleton with a high electron transporting property, an oxa-diazole derivative, a triazole derivative, or a phenanthroline derivative as the second organic compound. In particular, compounds shown by: tris(8-quinolinolate) aluminum; bis(10-hydroxybenzo[h]-quinolate) beryllium; 2-(4-biphenylyl)-5-(4-tert-butylphenyl)1,3,4-oxadiazole; 1,3-bis[5-(p-tert-butylphenyl)-1,3,4-oxadiazole-2-ir]benzene; 3-(4-tert-butylphenyl)-4-phenyl-5-(4-biphenytyl)-1,2,4-triazole; and 3-(4-tert-butylphenyl)-4-(4-ethylphenyl)-5-(4-biphenylyl)-1,2,4-triazole are mainly used.

Further, a method of imparting the function of a guest by adding a third organic compound into the concentration change region as the guest in implementing continuous junction as discussed above, can be considered. From the standpoint of the function expression, it is preferable that a light emitting compound be used as the guest. This is because it can be considered that the carrier recombination ratio and the light emitting efficiency can be increased when the first organic compound and the second organic compound forming the concentration change region are given the carrier transporting property and the blocking property, and a light emitting compound is added to the concentration change region.

A conceptual diagram of this idea is shown in FIG. 3A. An organic compound film 303 containing a first organic compound and a second organic compound is formed between an anode 302 and a cathode 304 on a substrate 301 in FIG. 3A, and a light emitting compound 306 for emitting light is added to a concentration change region 305 to form a light emitting region.

It is preferable to use, as the light emitting compound, a complex such as a metal complex containing a quinoline skeleton a metal complex containing a benzo-oxazole skeleton, or a metal complex containing a benzo-diazole skeleton, which gives stable light emission. In particular, compounds shown by: tris(8-quinolinolate) aluminum; tris(4-methyl-8-quinolinolate)aluminum; and bis(10-hydrozybenzo[h]-quinolinate) beryllium are mainly used.

Speaking from the standpoint of the efficiency of light emission, organic light emitting elements, which are capable of converting energy emitted in returning from a triplet excitation state to a ground state (hereafter referred to as "triplet excitation energy") into light emission, have been in the spotlight in recent years due to their high light emitting efficiency, (Reference 7: D. F. O'Brien. M. A. Baldo, M. E. Thompson and S. R. Forrest, "Improved energy transfer in electrophosphorescent devices," Applied Physics Letters, vol. 74, No. 3, 442-444 (1999)), (Reference 8: Tetsuo TSUTSUI, Moon-Jae YANG, Masayuki YAHIRO, Kenji NAKAMURA, Teruichi WATANABE, Taishi TSUJI. Yoshinori FUKUDA, Takeo WAKIMOTO and Satoshi MIYAGUCHI. "High Quantum Efficiency in Organic Light-Emitting Devices with Iridium-Complex as a Triplet Emissive Center", Japanese Journal of Applied Physics, Vol. 38, L1502-L1504 (1999)).

Metal complexes having platinum as their central metal are used by reference 7, and metal complexes having iridium as their central metal are used by reference 8. These organic light emitting elements capable of converting triplet excitation energy into light emission (hereafter referred to as "triplet light emitting element") are capable of achieving higher brightness light emission and higher efficiency light emission than conventional light emitting elements.

However, according to the example reported in reference 8, there is a problem with the lifetime that the half life of the brightness is on the order of 170 hours when the initial brightness is set to 500 cd/m². Extremely a high functional light emitting element with a long element lifetime, in addition to light emission with high brightness and high light emission efficiency by emitting light from a triplet excitation state, become possible in accordance with applying the present invention to a triplet light emitting element.

Therefore, a case of selecting a material capable of converting triplet excitation energy into light emission as the third organic compound as a guest, and adding the material to the concentration change region, is also included in the present invention.

It is not necessary to limit the light emitting compounds for emitting light that can be considered as the third organic compounds. In particular, in a case in which the first organic compound or the second organic compound emit light, it is preferable to use as the third organic compound an organic compound (a compound capable of blocking carriers and molecular excitons) in which the energy difference between the highest occupied molecular orbital and the lowest empty molecular orbital (hereafter referred to as "excitation energy level") is large compared to that of the first organic compound and the second organic compound. It thus becomes possible with this method to increase the carrier recombination ratio and to increase the light emission efficiency, in the concentration change region formed by the first organic compound and the second organic compound.

A conceptual diagram of this method is shown in FIG. 3B. The organic compound film 303 containing the first organic compound and the second organic compound is provided between the anode 302 and the cathode 304 on the substrate 301 in FIG. 3B, and a compound 307 capable of blocking carriers and molecular excitons is added to the concentration change region 305.

Note that a light emitting region to which the light emitting compound 306 for emitting light is additionally added, is also provided in the concentration change region 305 in FIG. 3B. Namely, this is an embodiment which is merged with the method of using a light emitting compound for emitting light as the third organic compound (FIG. 3A). The compound 307 capable of blocking carriers and molecular excitons is located closer to the cathode side than the light emitting element 306 for emitting light here, and therefore a compound with the hole blocking property may be used as the compound 307 capable of blocking carriers and molecular excitons.

It is preferable to use a phenanthroline derivative, an oxadiazole derivative, or a triazole derivative which has high excitation energy level as the compound capable of blocking carriers and molecular excitons. In particular, compounds such as vasopheanthroline, vasocuproin and those shown by: 2-(4-biphenylyl)-5-(4-tert-butylphenyl)-1,3,4-oxadiazole; 1,3-bis[5-(p-tert-butylphenyl)-1,3,4-oxadiazole-2-yl]benzene; 3-(4-tert-butylphenyl)-4-phenyl-5-(4-biphenylyl)-1,2, 4-triazole; and 3-(4-tert-butylphenyl)-4-(4-ethylphenyl)-5-(4-biphenylyl)-1,2,4-triazole are mainly used.

Note that, it can be considered that elemental analysis by SIMS can be a very important technique for a case of specifying concentration change regions discussed above. In particular, it can be considered that a difference appears compared to a conventional lamination structure if the concentration change is continuous, as is understood from the conceptual diagrams shown by FIGS. 2A and 2B.

Therefore, a light emitting device, which has a region in which a detected amount of an element that can be detected by SIMS, from among the elements consisting of the first organic compound or the second organic compound, changes continuously in a direction from the anode to the cathode, are included in the present invention.

Further, a continuous concentration change can be detected by detecting a metallic element in a case of using the first organic compound or the second organic compound as a metallic complex. Aluminum, zinc, or beryllium is mainly used as the metallic element contained in the metal complex often used in the organic light emitting element.

In addition, a light emitting device in which the third organic compound, that can be detected by SIMS, is detected in a region containing both the first organic compound and the second organic compound (namely, the concentration change region) in a case of adding the third organic compound as a guest to the concentration change region, are included in the present invention.

Furthermore, there is a case in which a metal complex is used as the compound which becomes the guest, in particular as a light emitting compound for emitting light. A light emitting device, in which the third organic compound is a metal complex having a metal element, and in which the metal element that can be detected by SIMS is detected in a region containing both the first organic compound and the second organic compound (namely, the concentration change region), is therefore also included in the present invention.

Aluminum, zinc, or beryllium is mainly used as the metallic element contained in the metal complex used as the light emitting compound. Further, a metal complex having iridium or platinum as its central metal is in the mainstream in a case that the third organic compound is a light emitting compound that emits light from a triplet excitation state, and therefore iridium or platinum can be detected.

A light emitting device having a long lifetime and having a driver voltage that is lower than that of a conventional light emitting device, can thus be provided by implementing the present invention. In addition, electronic equipment with lower electric power consumption and a longer life than conventional electronic equipment, can be provided by manufacturing the electronic equipment using the light emitting device.

BRIEF DESCRIPTION OF THE DRAWINGS

In the accompanying drawings:

FIGS. 17A and 17B are diagrams showing an upper surface structure and a cross sectional structure, respectively, of a light emitting device;

DETAILED DESCRIPTION OF THE PREFERRED EMBODIMENTS

Embodiment Mode

An embodiment of implementing the present invention is discussed below. Note that, although at least one electrode, an anode or a cathode, may be transparent in an organic light emitting element in order to extract light, an element structure in which a transparent anode is formed on a substrate and light is taken out from the anode is discussed in the embodiment mode. In practice, it is also possible to apply to the present invention structures in which light is extracted form the cathode, or structures in which light is taken out from the opposite side of the substrate.

A manufacturing process for forming a mixed region and a concentration change region is important in implementing the present invention. The applicants of the present invention propose a process utilizing a vacuum evaporation process for forming a mixed region and a concentration change region in an organic compound film containing low molecular weight compounds which are capable of undergoing vacuum evaporation. A method of manufacturing a light emitting device using the organic light emitting element disclosed in the present invention is then discussed.

In conventional processes, in particular in mass production processes, steps are taken so that the various materials are not contaminated in laminating a hole transporting material, a light emitting layer material, an electron transporting material, and the like by vacuum evaporation, and therefore an evaporation apparatus with a multi-chamber method (in-line method) is used. A top surface diagram of the evaporation apparatus is shown in FIG. 4.

Figure 4:
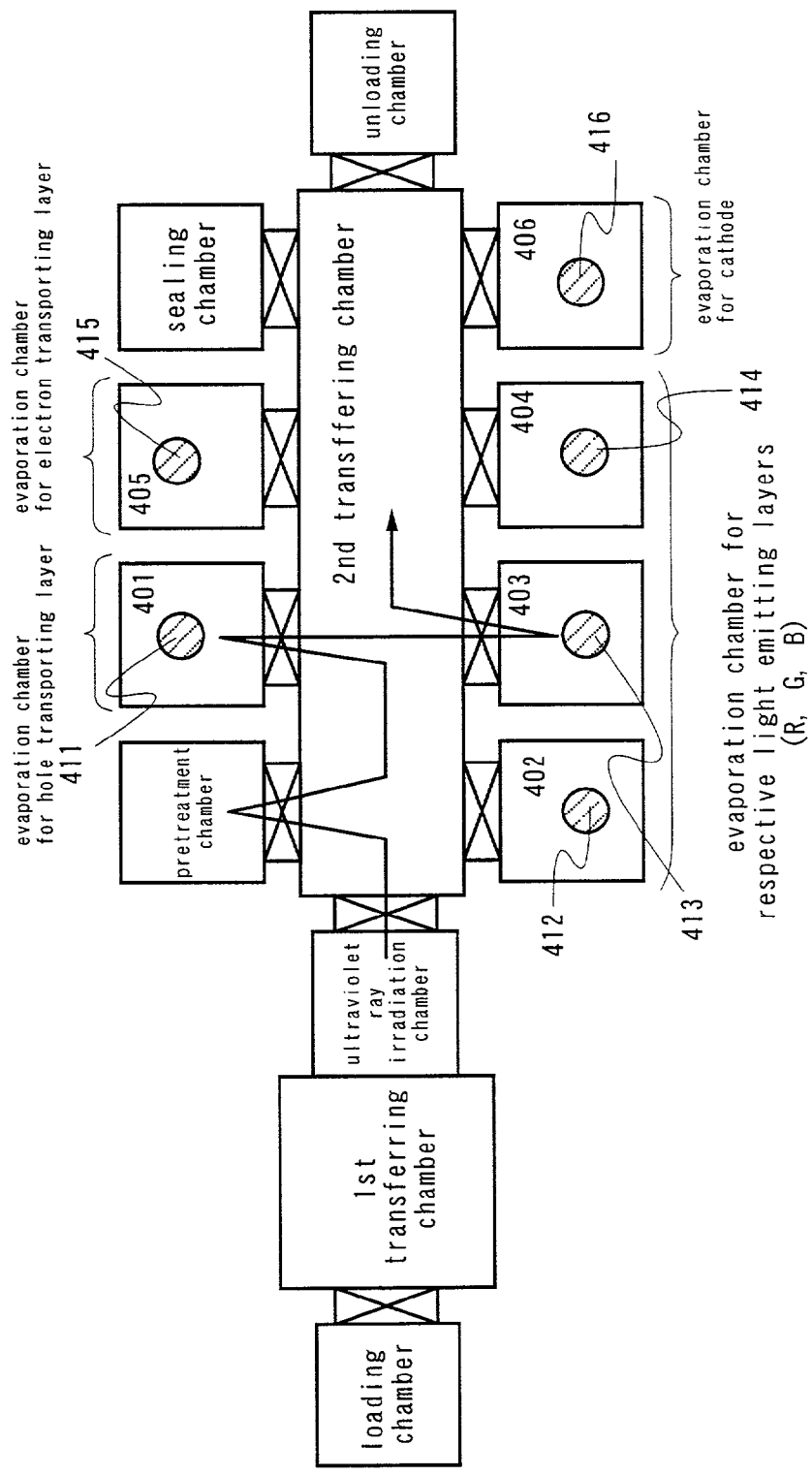
FIG. 4 is a diagram showing an evaporation apparatus.

The example shown in FIG. 4 is a conceptual diagram of an evaporation apparatus for forming a three-layer structure of a hole transporting layer, a light emitting layer, and an electron transporting layer (a double hetero structure). First, a substrate having an anode (such as ITO) is entered to a loading chamber, and a surface of the anode is cleaned by irradiating ultraviolet light in a vacuum atmosphere in an ultraviolet ray irradiation chamber. In particular, oxidation processing is performed in a pretreatment chamber in the case that the anode is an oxide such as ITO. In addition, a hole transporting layer is formed in an evaporation chamber

401, light emitting layers are formed in evaporation chambers 402 to 404 (the three colors of red, green, and blue in FIG. 4), and an electron transporting layer is formed in an evaporation chamber 405. A cathode is formed by evaporation in an evaporation chamber 406. Sealing is performed lastly in a sealing chamber, and the substrate is taken out from an unloading chamber. An organic light emitting element is thus obtained.

A feature of this in-line evaporation type apparatus is that formation of each layer by evaporation is performed in a different evaporation chamber among the evaporation chambers 401 to 406. Therefore, a single evaporation source (one of 411 to 416) may normally be provided in each of the evaporation chambers 401 to 406 (however, there is case that two evaporation sources are necessary in order to form a co-evaporation layer in forming the light emitting layer with doping of a pigment.) In other words, this apparatus has a structure in which the materials for each layer almost never mix with each other.

Figure 5A:
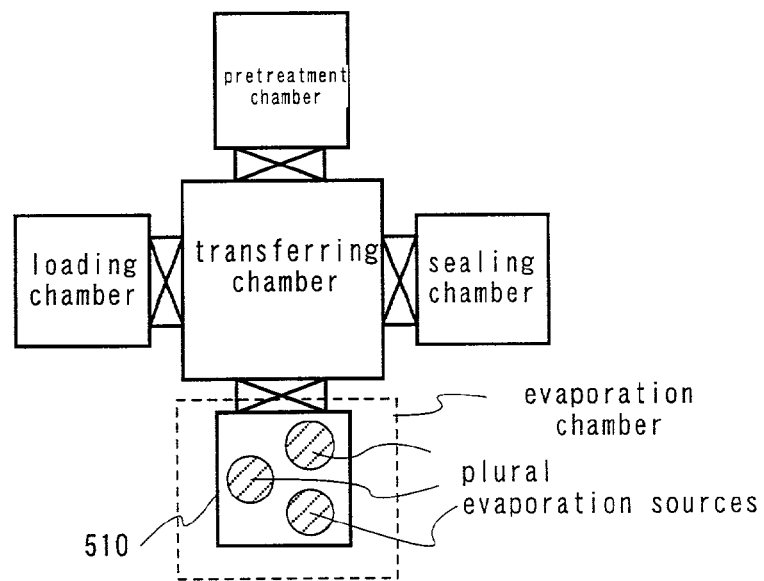
FIGS. 5A and 5B are diagrams showing an evaporation apparatus.
Figure 5B:
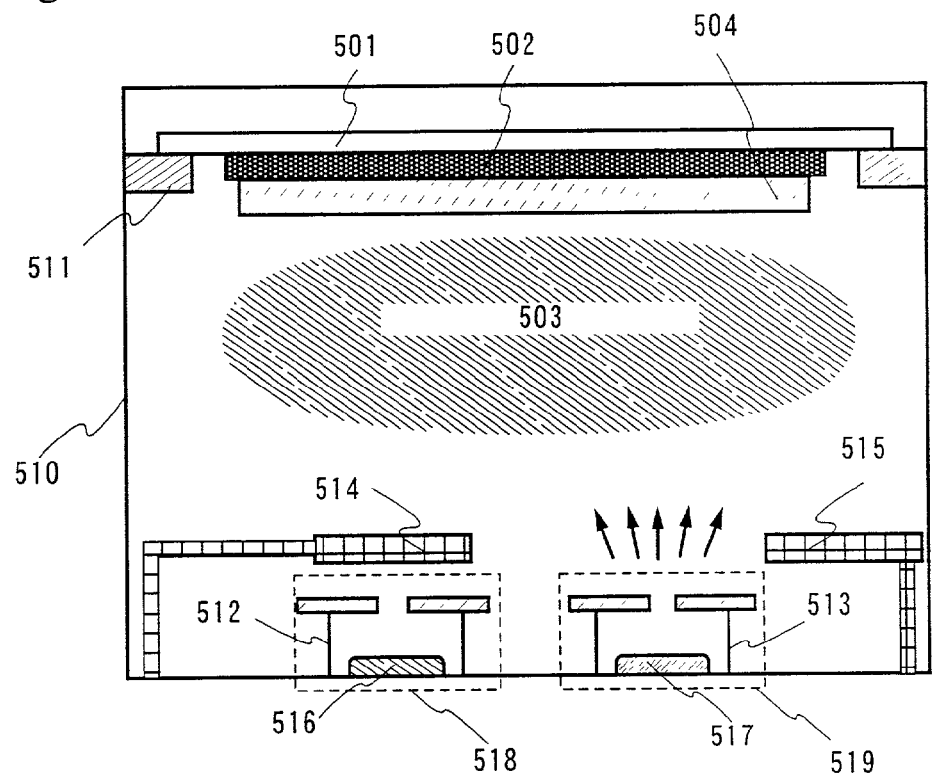

On the other hand, a conceptual diagram of an evaporation apparatus for manufacturing an organic light emitting element according to the present invention is shown in FIGS. 5A and 5B. FIG. 5A is a top surface diagram of the evaporation apparatus. One vacuum chamber 510 is disposed as an evaporation chamber, and a plurality of evaporation sources are formed within the vacuum chamber. This is a single chamber method. Different materials with different functions, such as a hole injecting compound, a hole transporting compound, an electron transporting compound, an electron injecting compound, a blocking compound, a light emitting compound, and a material for a cathode, are stored separately in the plurality of evaporation sources.

In an evaporation apparatus having this type of evaporation chamber, first a substrate having an anode (such as ITO) is first entered into an loading chamber, and an oxidation process is performed in a pretreatment chamber in the case that the anode is an oxide such as ITO (note that. although not shown in FIG. 5A, it is also possible to establish an ultraviolet ray irradiation chamber for cleaning a surface of the anode.) In addition, all materials for forming an organic compound film are formed by evaporation within a vacuum chamber 510. A cathode may also be formed within the vacuum chamber 510, or may also be formed in a separately arranged evaporation chamber. The point is that the organic compound film may be formed within one vacuum chamber, the vacuum chamber 510. Sealing is performed lastly in a sealing chamber, and the substrate is taken out from an unloading chamber. An organic light emitting element are thus obtained.

Procedures for manufacturing the organic light emitting element of the present invention using this type of single chamber method are explained using FIG. 5B (a cross sectional diagram of the vacuum chamber 510). In order to simplify the drawing, it is shown as a process in FIG. 5B to form a mixed region and a concentration change region from a first organic compound 516 and a second organic compound 517 using the vacuum chamber 510 with two evaporation sources (an organic compound evaporation source a 518 and an organic compound evaporation source b 519).

First, a substrate 501 having an anode 502 is entered into the vacuum chamber 510, and fixed by a fixing unit 511 (normally the substrate is made to rotate during evaporation). Next, the inside of the vacuum chamber 510 is reduced (to a level on the order of $10^{-4}$ Pa), after which a container a 512 is heated and the first organic compound 516 is evaporated. A shutter a 514 is opened after a predetermined evaporation rate (units of Å/s) is obtained, and evaporation begins.

When the shutter a 514 is closed and heating of the container a 512 is stopped, the first organic compound 516 is made not to evaporate. At this point, an atmosphere 503 containing the first organic compound has developed within the vacuum chamber 510. In addition, while maintaining this state, the second organic compound 517 is made to evaporate by heating a container b 513 and opening a shutter b 515 (state shown by FIG. 5B). It becomes possible to form an organic compound film 504 having a mixed region or a concentration change region by the above procedures.

Figure 6A:
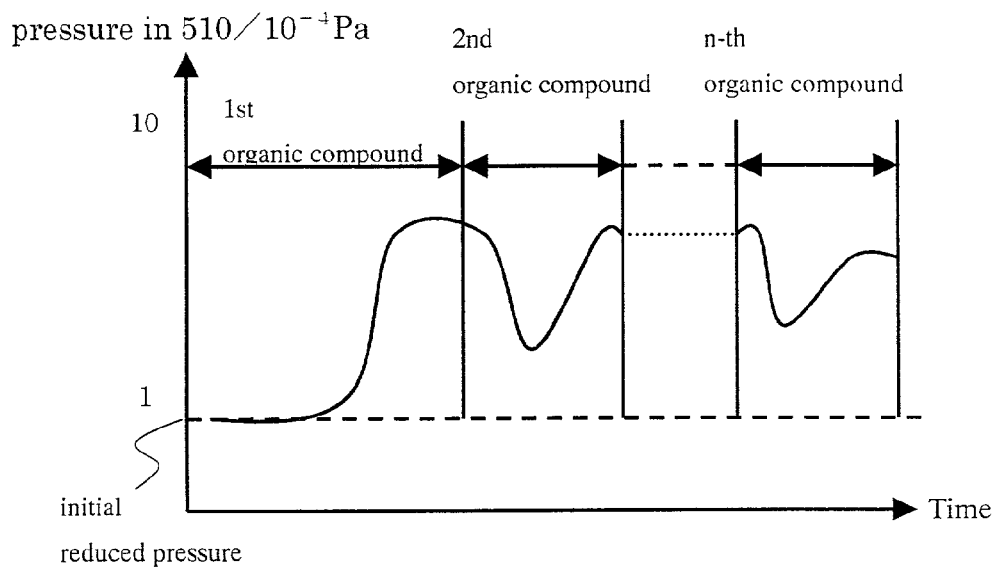
FIGS. 6A and 6B are diagrams showing vacuum levels during evaporation.

Further, there is a method of paying attention to the pressure within the vacuum chamber as shown in the conceptual diagram in FIG. 6A, as a specific method for utilizing an atmosphere in which a previously evaporated organic compound exists. Namely, if a certain organic compound is evaporated, the pressure within the vacuum chamber increases in comparison to the initial reduced pressure state before starting evaporation. The mixed region and the concentration change region are formed by evaporating the next organic compound while the vacuum chamber has not completely returned to its initial reduced pressure state even with continuing to operate a vacuum pump.

It can be seen from FIG. 6A that an atmosphere in which the previously evaporated organic compound exists can be utilized by setting the interval between evaporations shorter in forming an organic compound film within one vacuum chamber.

This method can also be used in a case of forming a clear lamination structure during processing. Such a structure can be achieved by evaporating the next organic compound after waiting until the pressure within the vacuum chamber returns to its initial reduced pressure state. The applicable range of the present invention is wide.

Figure 6B:
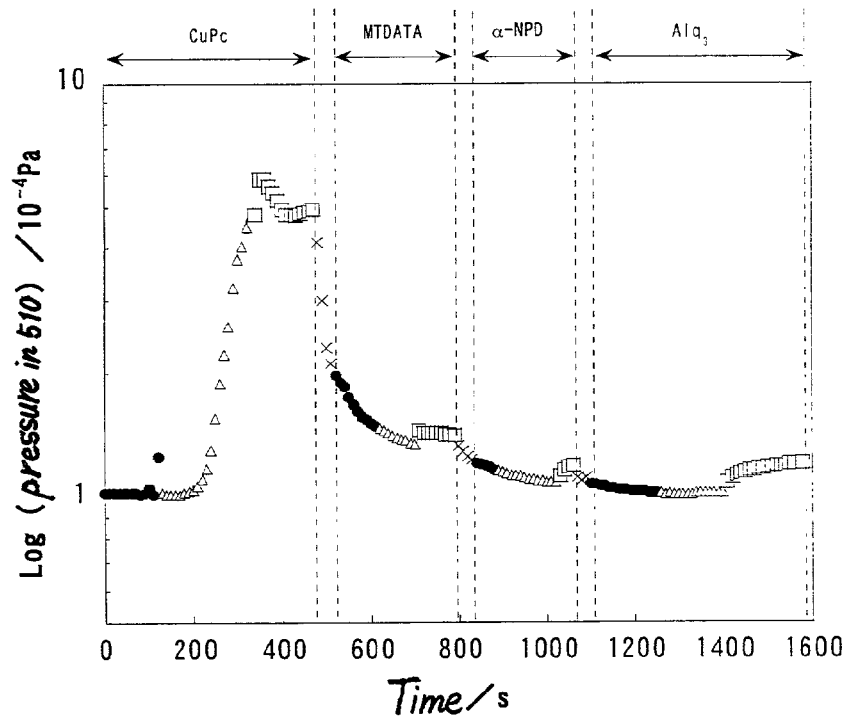

FIG. 6B is a diagram showing pressure changes within a vacuum chamber when copper phthalocyanine (hereafter referred to as "CuPc"); 4,4',4''-tris[N-(3-methylphenyl)-N-phenyl-amino]-triphenylamine (hereafter referred to as "MTDATA"); 4,4'-bis[N-(1-naphthyl)-N-phenyl-amino]biphenyl (hereafter referred to as "α-NPD"); and tris(8-quinolinolate) aluminum (hereafter referred to as "Alq$_3$") are evaporated in order within one vacuum chamber.

A heating period in FIG. 6B (solid black circles in the figure: ●) expresses a period which begins when electric current begins to flow in a resistance heater until the organic compound begins to evaporate. An evaporation rate control period (white triangles in the figure: △) expresses a period which begins when the organic compound begins to evaporate until the shutter is opened. An evaporation period (white squares in the figure: □) expresses a period for evaporation with the shutter open, and an interval period (shown by the letter x in the figure) is a period continuing until heating of the next organic compound is started. Data was plotted by recording every 10 seconds.

Then, in addition to the procedures stated above for forming the mixed region and the concentration change region, it is preferable to perform heat treatment under a reduced pressure equal to or less than $10^{-4}$ Pa after forming the organic compound film and the cathode. Diffusion of the organic molecules is induced by adding this treatment, and formation of the concentration change region, in particular the continuous concentration change region, becomes easy. The temperature of the heat treatment may be a temperature at which glass transitions, volume changes, and the like do not develop, preferably on the order of 60 to 100° C.

The mixed region and the concentration change region disclosed by the present invention can be formed by the method of manufacture discussed above.

EMBODIMENTS

Embodiment 1

An example of manufacturing the organic light emitting element disclosed by the present invention in an evaporation chamber, in which two organic compound evaporation sources are set within one vacuum chamber, is shown in Embodiment 1.

First, a glass substrate, on which a film of indium tin oxide (hereafter referred to as "ITO") with a thickness of 100 nm is formed by sputtering to form an anode, is prepared. The glass substrate having the anode is then carried into the vacuum chamber.

Next, as disclosed by the present invention, 4,4'-bis[N-(3-methylphenyl)-N-phenyl-amino]-biphenyl (hereafter referred to as NPD) is evaporated and thereafter $Alq_3$ is evaporated within the one vacuum chamber to form an organic compound film with a total film thickness on the order of 100 nm. An Mg::Ag alloy is then evaporated on the order of 150 nm as a cathode.

Figure 1A:
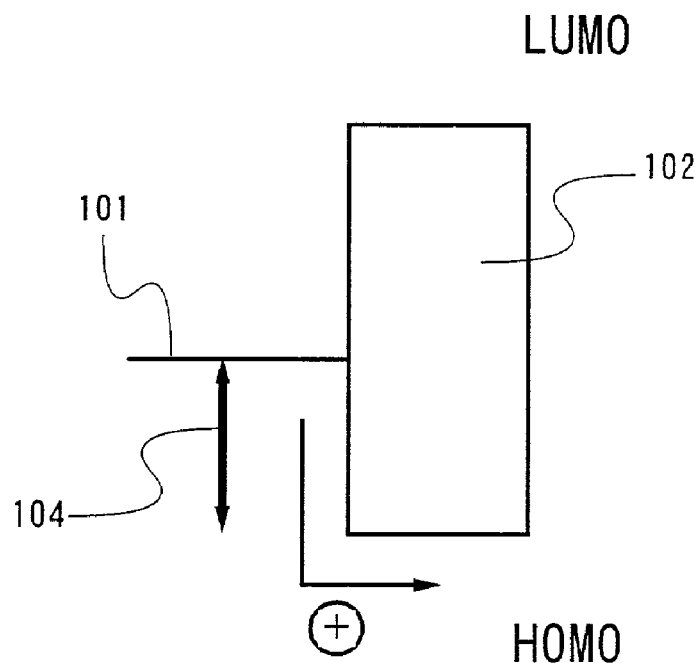
FIGS. 1A and 1B are diagrams showing the role of a hole injecting layer.
Figure 1B:
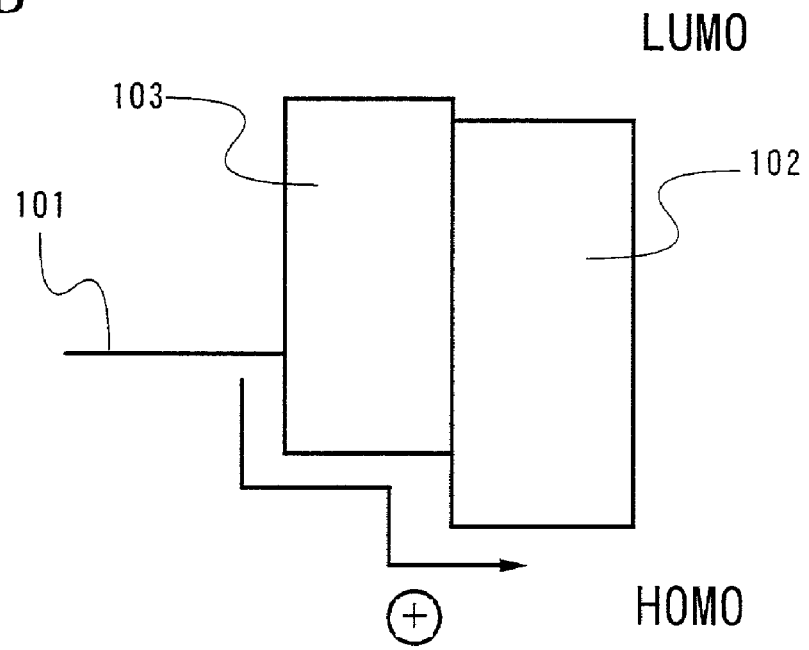
Figure 2A:
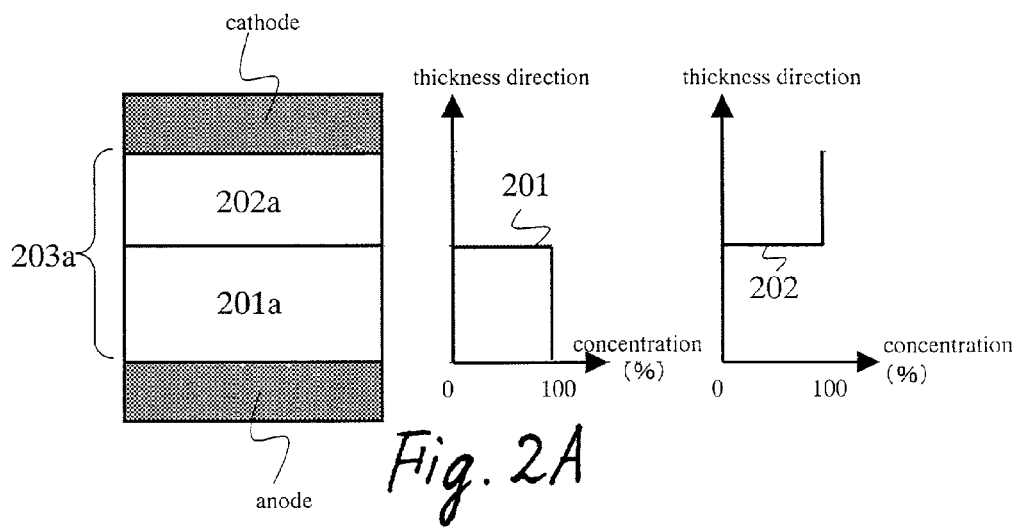
FIGS. 2A and 2B are diagrams showing structures of organic light emitting elements.
Figure 2B:
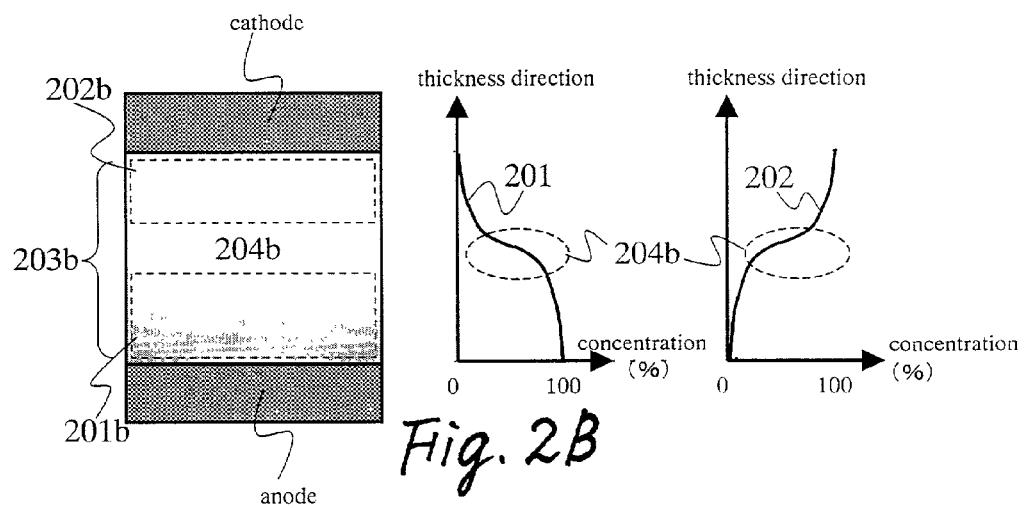
Figure 3A:
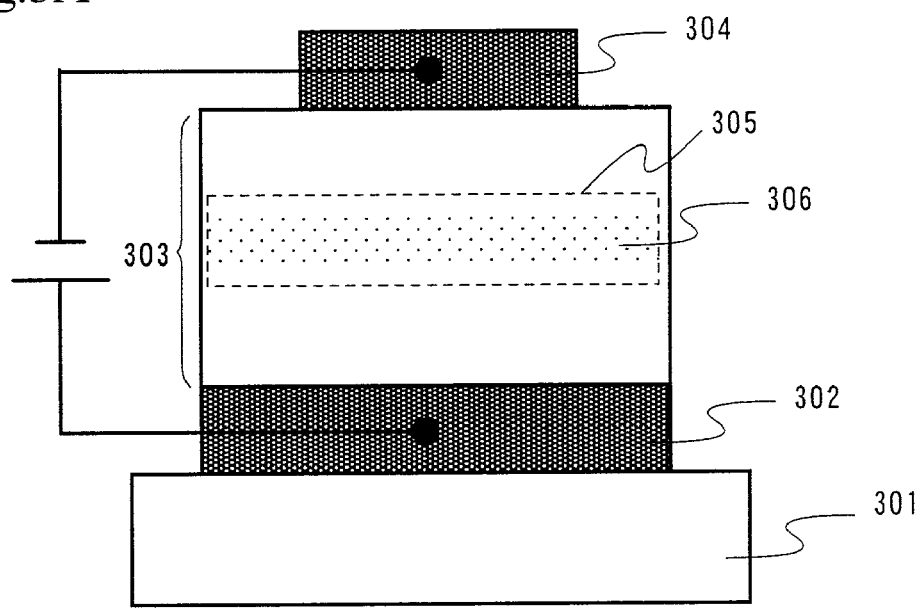
FIGS. 3A and 3B are diagrams showing structures of organic light emitting elements.
Figure 3B:
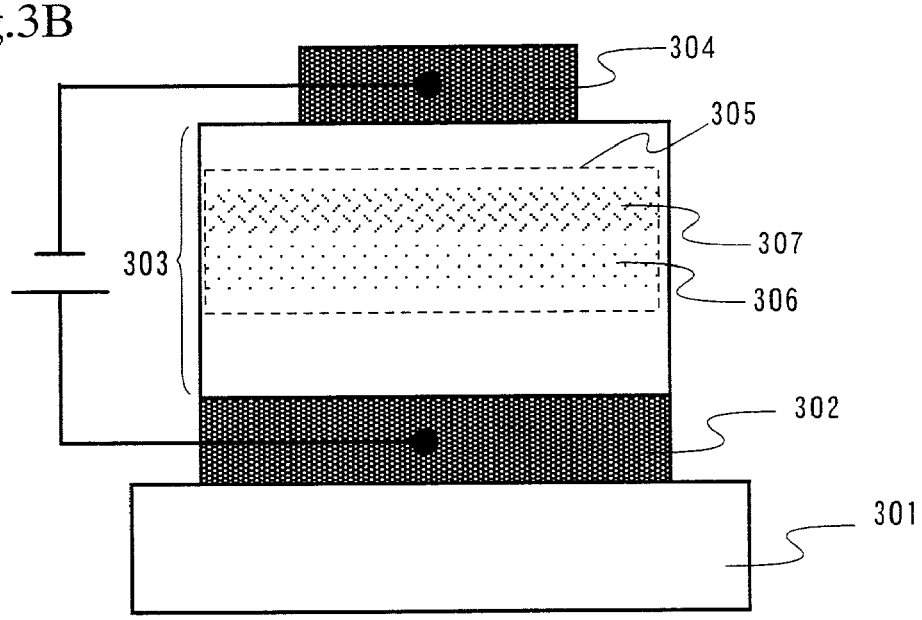
Figure 7:
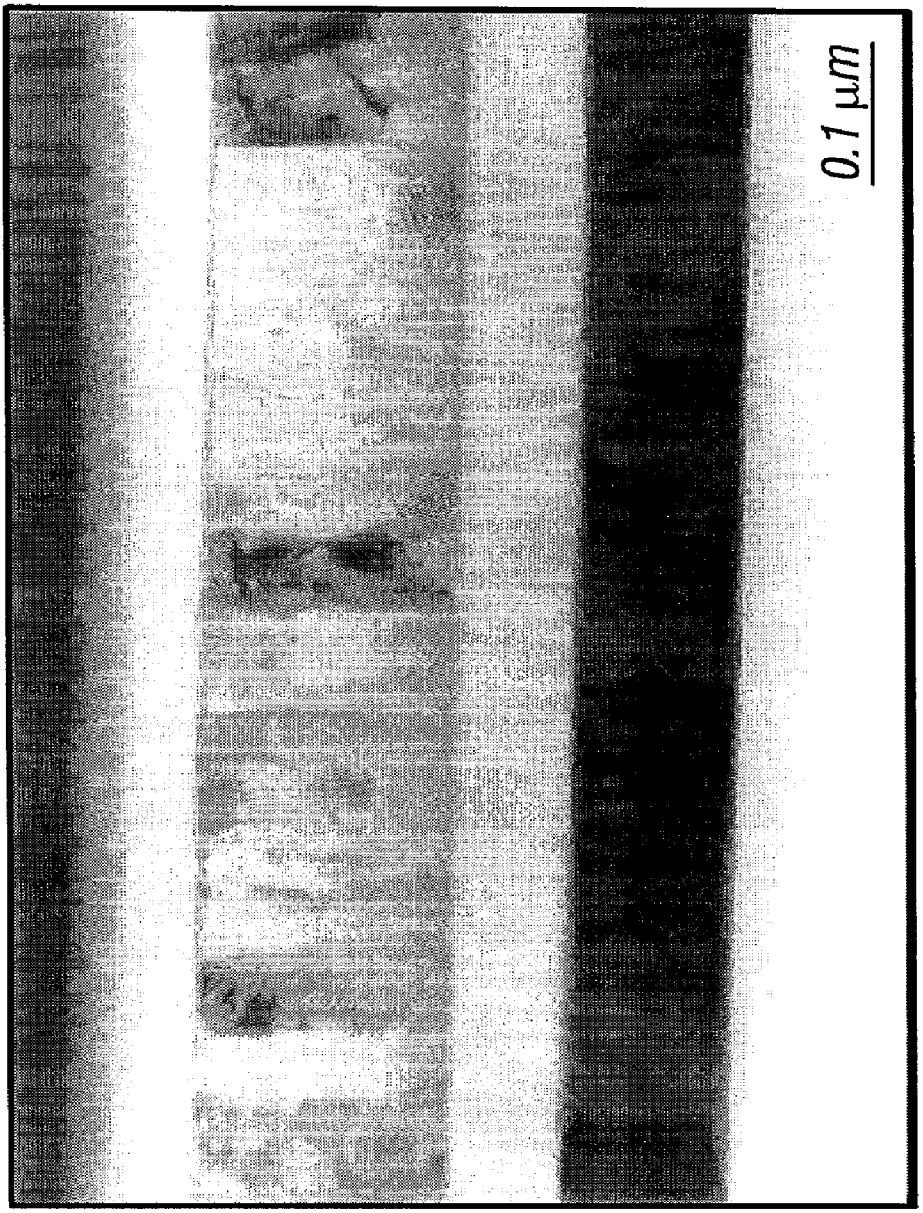
FIG. 7 is a diagram showing a cross sectional TEM photograph of an organic compound film.
Figure 8A:
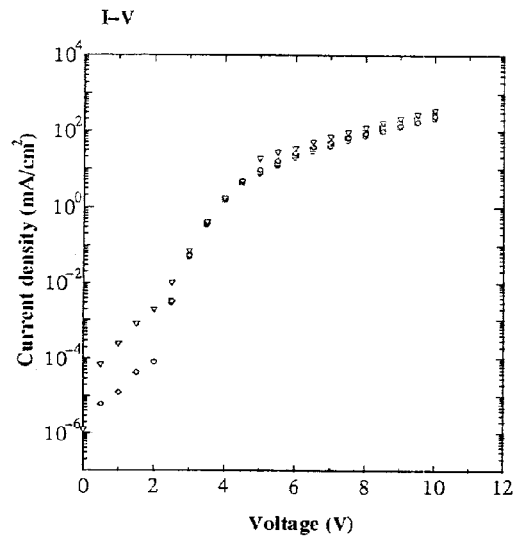
FIGS. 8A to 8D are diagrams showing properties of organic light emitting elements.
Figure 8B:
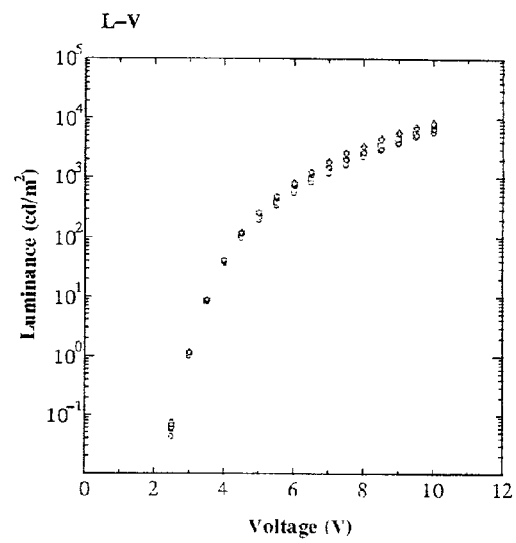
Figure 8C:
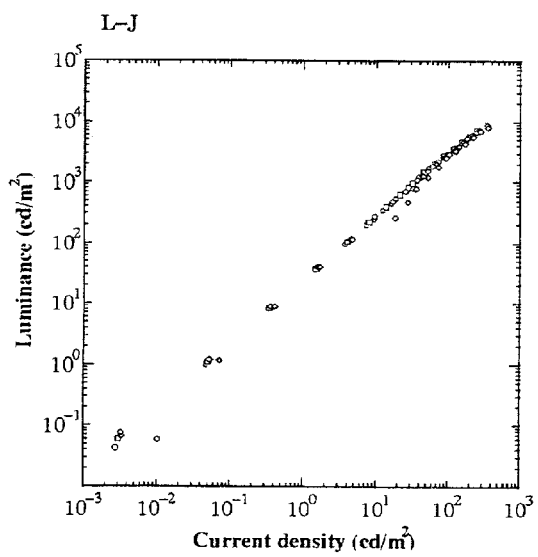
Figure 8D:
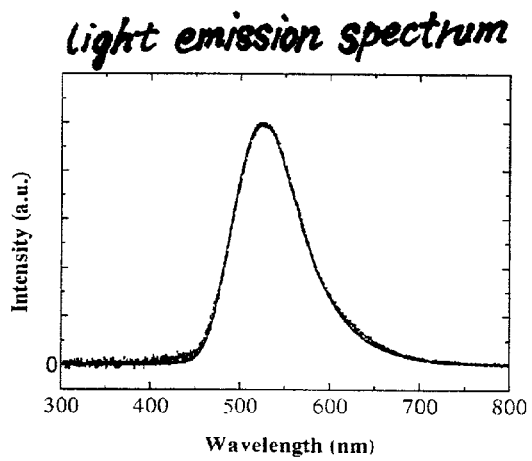

A cross sectional TEM photograph of the organic light emitting element thus formed is shown in FIG. 7. A clear organic interface does not exist within the organic compound film formed by NPD and $Alq_3$ as shown in FIG. 7. This suggests that a mixed region and a concentration change region are formed in contrast to the lamination structure shown in FIG. 2A.

Element properties of the organic light emitting elements manufactured in Embodiment 1 are shown in FIGS. 5A to 8D. The current-voltage characteristics have a shape unique to elements exhibiting rectification, such as organic light emitting elements. Further, the light emission spectrum coincides with the light emitting spectrum of $Alq_3$, and it can be seen that each type of functional is expressed, namely, the hole transporting property of NPD and the light emitting property of $Alq_3$ (and its electron transporting property).

Embodiment 2

An example of manufacturing the organic light emitting element disclosed by the present invention in a vacuum chamber, in which a plurality of organic compound evaporation sources are set within one vacuum chamber, is shown in Embodiment 2. A triplet light emitting element is manufactured here using an indium complex as a light emitting compound.

Triplet light emitting elements that use indium complexes are manufactured by forming a multi-layer structure in most cases. One reason for this is because host materials, which give sufficiently a large excitation energy for exciting the indium complexes, are limited, and therefore it is necessary to separate the functions. Further, another reason is that the diffusion length of triplet molecular excitons is extremely long compared to that of singlet molecular excitons, and therefore it is necessary to use a blocking layer in order to prevent diffusion of the molecular excitons.

Figure 9:
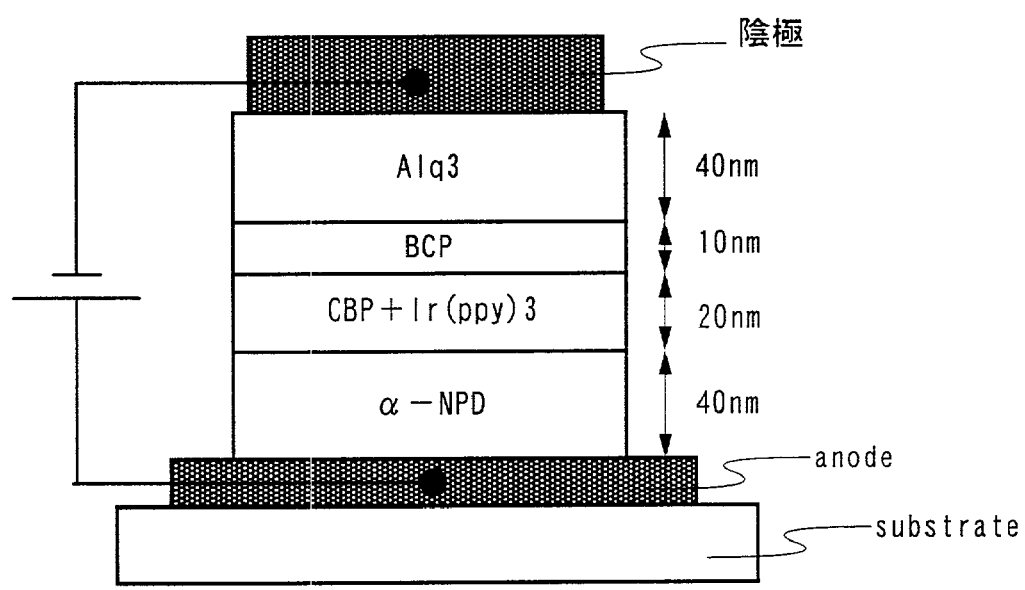
FIG. 9 is a diagram showing a structure of a conventional organic light emitting element.

A basic structure of a triplet light emitting element is shown in FIG. 9 (Reference 9: M. A. Baldo, S. Lamansky, P. E. Burrows, M. E. Thompson, and S. R. Forrest, "Very high-efficiency green organic light-emitting devices based on electrophosphorescence", Applied Physics Letters, vol. 75, No. 1, 4-6 (1999)). A multi layer structure (a four layer structure in reference 9) is formed in reference 9 by using 4,4'-N,N'-dicarbazole-biphenyl (hereafter referred to as "CBP") as a host with respect to tris(2-phenylpyridine) indium (hereafter referred to as "$Ir(ppy)_3$") which emits light from a triplet excitation state; and in addition, using vasocuproin (hereafter referred to as "BCP") as a blocking layer.

Figure 10A:
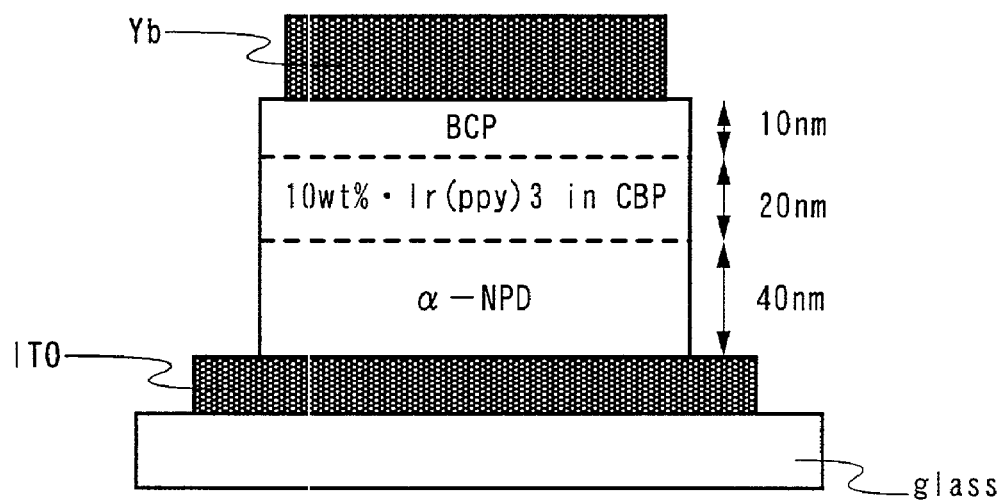
FIGS. 10A and 10B are diagrams showing a structure of an organic compound film in FIG. 11.

First, as a preparatory experiment, a cross section of an element manufactured by evaporating α-NPD, co-evaporating 10 wt % of $Ir(ppy)_3$ with CBP, and evaporating BCP in order within one vacuum chamber as disclosed by the present invention, was examined by TEM. The element structure and a film thickness computed from a film thickness monitor (liquid crystal oscillator) are shown in FIG. 10A. Further, a TEM photograph of the cross section thereof is shown in FIG. 11.

Figure 10B:
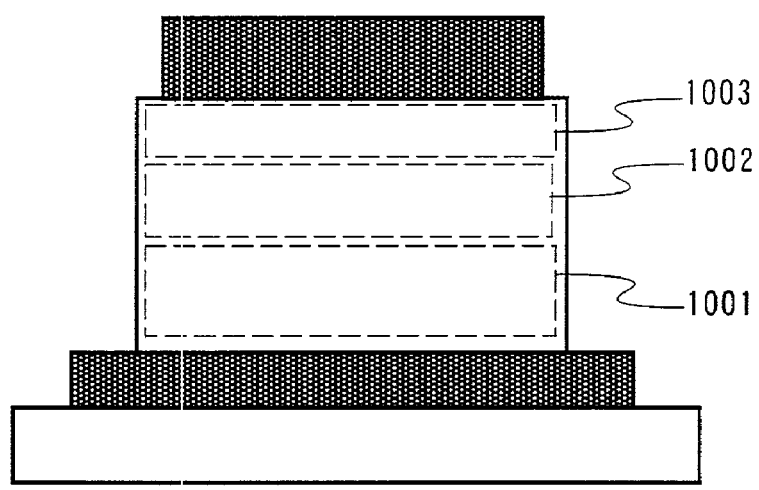
Figure 11:
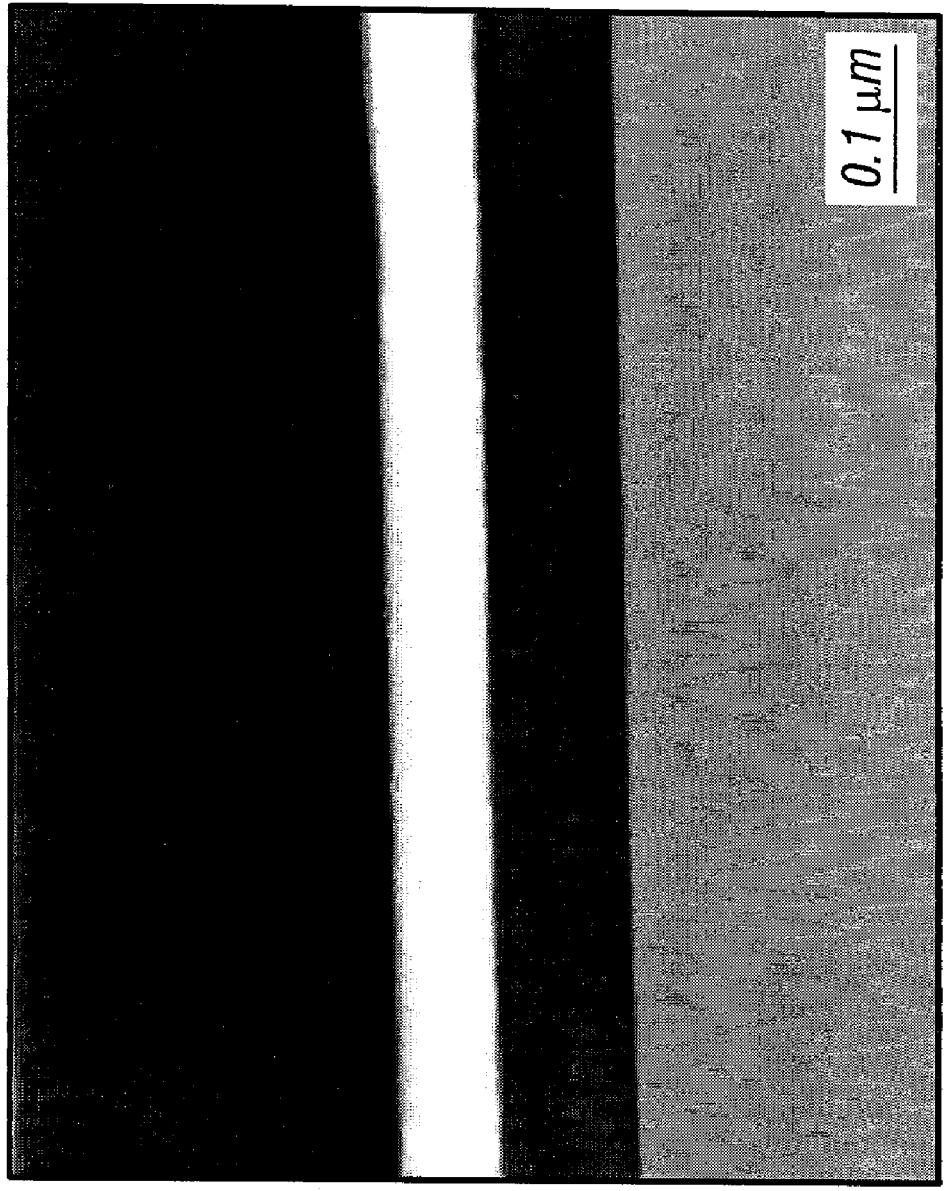
FIG. 11 is a diagram showing a cross sectional TEM photograph of an organic compound film.

FIG. 11 suggests that a clear organic interface does no exist within the organic compound film, and that the mixed region or the concentration change region are formed in contrast to the conventional multi-layer structure as shown in FIG. 9. From this it can be considered that a clear organic interface does not exist in the dashed line portion of FIG. 10A although a region 1001 in which the function of α-NPD can be expressed, a region 1002 in which the function of $IR9ppy)_3$ and the function of CBP can be expressed, and a region 1003 in which the function of BPC can be expressed, all actually exist as shown in FIG. 10B.

Figure 12A:
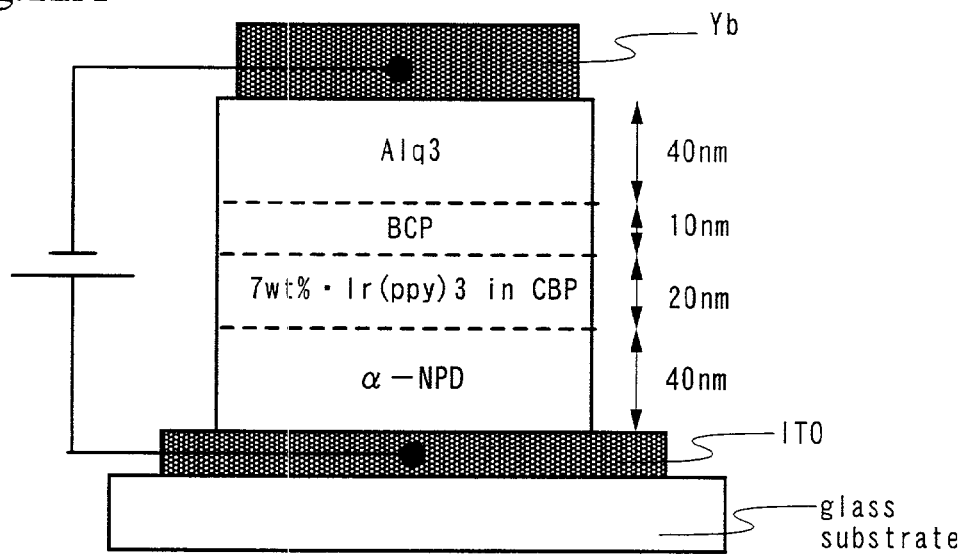
FIGS. 12A and 12B are diagrams showing structures of light emitting elements.

The fact that a clear organic interface does not exist has been suggested. Now, an element as shown in FIG. 12A was manufactured in order to confirm whether or not each material can actually express its function to achieve light emission. The method of manufacturing the light emitting element is shown below.

First, a glass substrate on which a film of indium tin oxide (hereafter referred to as "ITO") is formed with a thickness of 100 nm by sputtering to form an anode, is prepared. The glass substrate having the anode is then carried into the vacuum chamber.

Next, as disclosed by the present invention, α-NPD is evaporated, 7 wt % $Ir(ppy)_3$ and CBP are co-evaporated, BCP is evaporated, and in addition, $Alq_3$ is evaporated in order to impart an electron transporting property to the cathode side, within the one vacuum chamber to form an organic compound film with a total film thickness on the order of 110 nm. Yb is then evaporated on the order of 400 nm as a cathode.

Element properties of the organic light emitting elements manufactured in Embodiment 2 are shown in FIGS. 13A to 13D. The current-voltage characteristics have a shape unique to elements exhibiting rectification, such as organic light emitting elements. Further, the light emission spectrum coincides with the light emitting spectrum of $Ir(ppy)_3$, and it can be seen that each type of function expressed, namely, the hole transporting property of α-NPD, the electron transporting property of $Alq_3$, the blocking property of BCP, the function of CPB as a host material, and the triplet light emission property of $Ir(ppy)_3$.

Figure 12B:
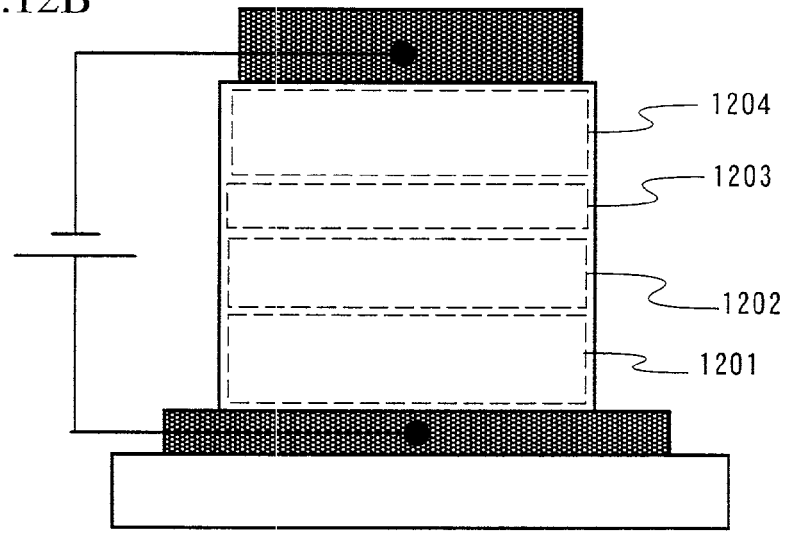
Figure 13A:
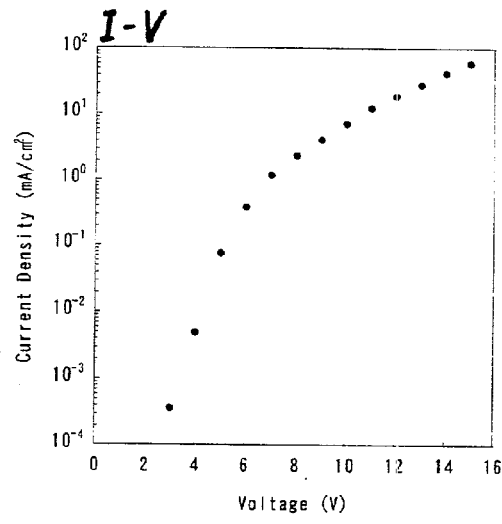
FIGS. 13A to 13D are diagrams showing properties of organic light emitting elements.
Figure 13B:
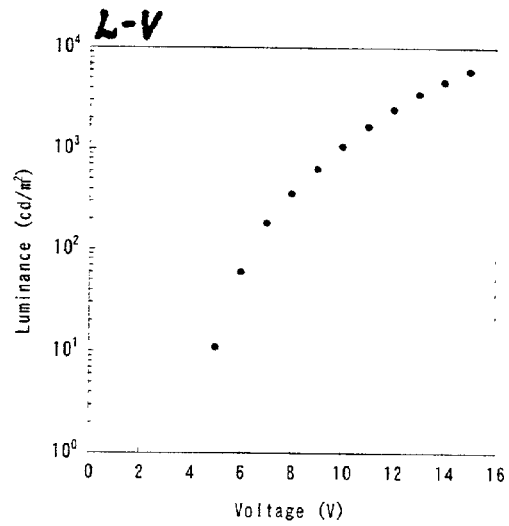
Figure 13C:
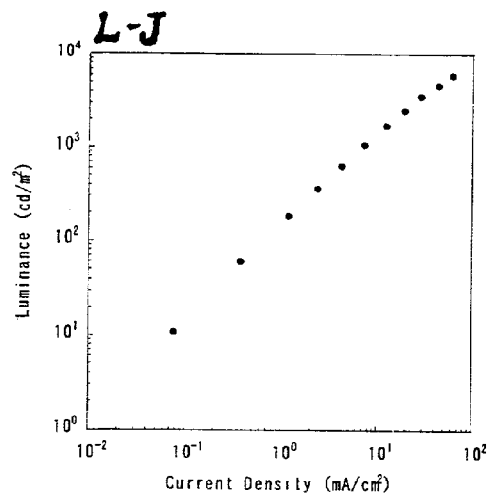
Figure 13D:
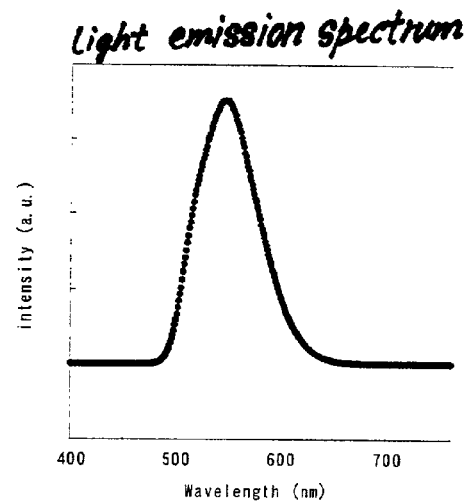

From this it can be considered that a clear organic interface does not exist in the dashed line portion of FIG. 12A although a region 1201 in which the function of α-NPD can be expressed, a region 1202 in which the function of $Ir(ppy)_3$ and the function of CBP can be expressed, a region 1203 in which the function of BCP can be expressed, and a region 1204 in which the function of $Alq_3$ can be expressed, all actually exist as shown in FIG. 12B.

Embodiment 3

Figure 14:
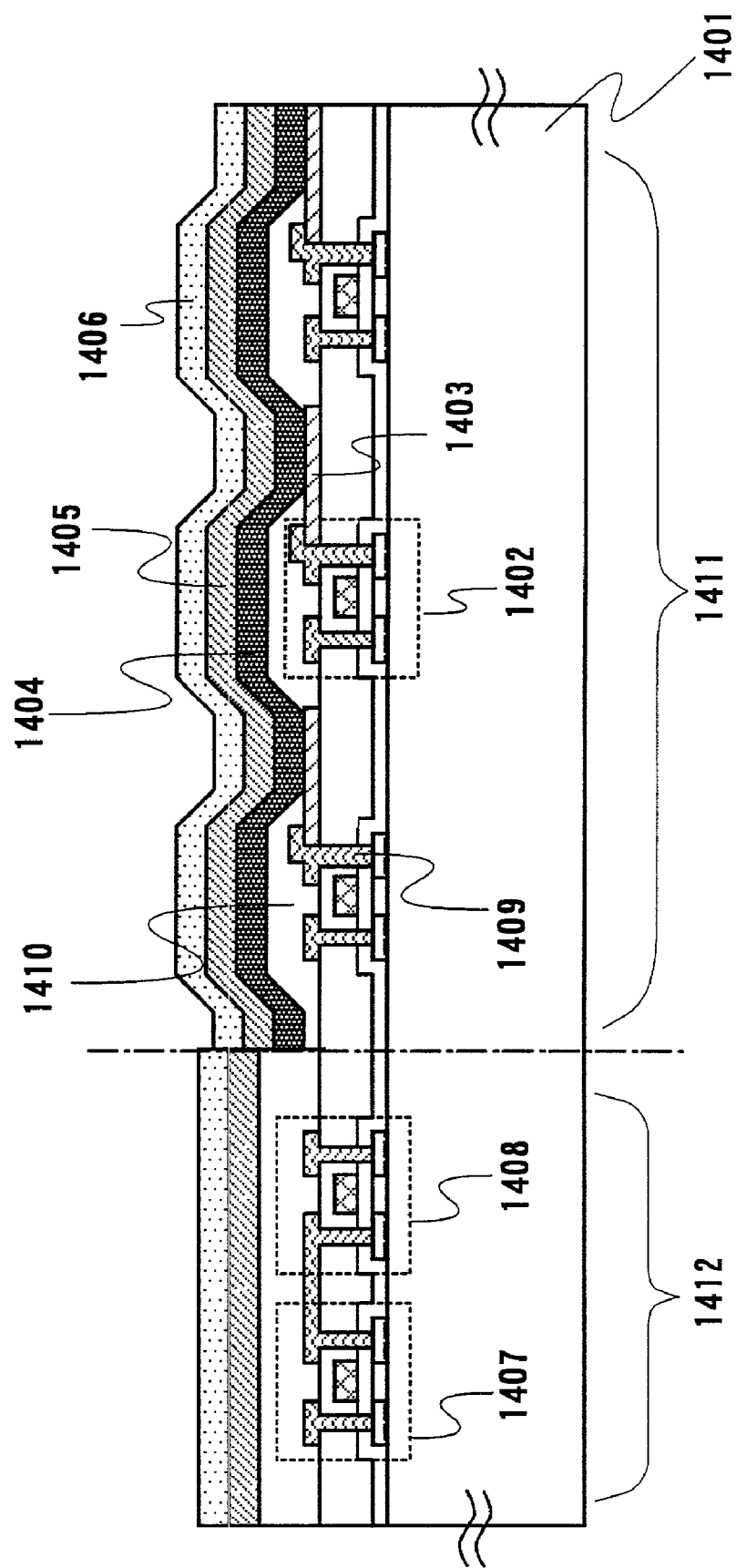
FIG. 14 is a diagram showing a cross sectional structure of a light emitting device.

A light emitting device containing the organic light emitting elements disclosed by the present invention is explained in Embodiment 3. FIG. 14 is a cross sectional diagram of an active matrix light emitting device that uses the organic light emitting elements of the present invention. Note that although thin film transistors (hereafter referred to as "TFTs") are used here as active elements, MOS transistors may also be used.

Further, the example shown here uses top gate TFTs (specifically, planer TFTs) as the TFTs, but bottom gate TFTs (typically reverse stagger TFTs) can also be used.

Reference numeral 1401 denotes a substrate in FIG. 14, and a substrate through which visible light can pass is used as the substrate. Specifically, a glass substrate, a quartz substrate, a crystallized glass substrate, or a plastic substrate (including plastic films) may be used. Note that an insulating film formed on the surface is also included in the substrate 1401.

A pixel portion 1411 and a driver circuit portion 1412 are formed on the substrate 1401. The pixel portion 1411 is explained first.

The pixel portion 1411 is a region for performing image display. A plurality of pixels exist on the substrate, and a TFT 1402 for controlling the amount of electric current flowing in an organic light emitting element (hereafter referred to as an "electric current control TFT"), a pixel electrode (anode) 1403, an organic compound film 1404, and a cathode 1405 are formed in each pixel. Note that although only the electric current control TFT is shown in FIG. 14, a TFT for controlling the amount of voltage applied to a gate of the electric current control TFT (hereafter referred to as a "switching TFT") is also formed.

It is preferable that a p-channel TFT be used for the electric current control TFT 1402. Although it is possible to use an n-channel TFT, using a p-channel TFT can more effectively suppress the amount of electric current consumption in the case where an anode of the organic light emitting element is connected to the electric current control TFT, as shown in FIG. 14.

Further, the pixel electrode 1403 is electrically connected to a drain of the electric current control TFT 1402. A conductive material having a work coefficient of 4.5 to 5.5 eV is used as a material for the pixel electrode 1403 in Embodiment 3, and therefore the pixel electrode 1403 functions as the anode of the organic light emitting element. Indium oxide, tin oxide, zinc oxide, or a compound of these (such as ITO) may typically be used as the pixel electrode 1403. The organic compound film 1404 is formed on the pixel electrode 1403.

In addition, the cathode 1405 is formed on the organic compound film 1404. It is preferable to use a conductive material having a work coefficient from 2.5 to 3.5 eV as a material for the cathode 1405. A conductive film containing an alkaline metal element or an alkaline earth metal element, a conductive film containing aluminum, a lamination of these conductive films with aluminum or gold, and the like may typically be used as the cathode 1405.

Further, the layer composed of the pixel electrode 1403, the organic compound film 1404, and the cathode 1405 is covered by a protective film 1406. The protective film 1406 is formed in order to protect the organic light emitting elements from oxygen and water. Silicon nitride, silicon oxynitride, aluminum oxide, tantalum oxide, or carbon (typically diamond like carbon) is used as a material for the protective film 1406.

The driver circuit 1412 is explained next. The driver circuit 1412 is a region for controlling the timing of signals sent to the pixel portion 1411 (gate signals and data signals), and a shift register, a buffer, a latch, an analog switch (transfer gate) and a level shifter are formed. A CMOS circuit composed of an n-channel TFT 1407 and a p-channel TFT 1408 is shown in FIG. 14 as a basic unit for these circuits.

Note that known structures may be used for the circuit structures of the shift register, the buffer, the latch, the analog switch (transfer gate), and the level shifter circuits. Further, although the pixel portion 1411 and the driver circuit 1412 are formed on the same substrate in FIG. 14, an IC or LSI can also be electrically connected without forming the driver circuit.

Furthermore, although the pixel electrode (anode) 1403 is electrically connected to the electric current control TFT 1402 in FIG. 14, a structure in which the cathode is connected to the electric current control TFT can also be used. In that case the pixel electrode may be formed by the same material as that of the cathode 1405, and the cathode may be formed by the same material as that of the pixel electrode (anode) 1403. It is preferable that the electric current control TFT be an n-channel TFT in this case.

The light emitting device shown in FIG. 14 is one manufactured by a step of forming a wiring 1409 after forming the pixel electrode 1403. In this case there is the possibility that the pixel electrode 1403 will have surface roughness. The organic light emitting element is an electric current driven element, and therefore it is thought that its properties will deteriorate due to surface roughness of the pixel electrode 1403.

Figure 15:
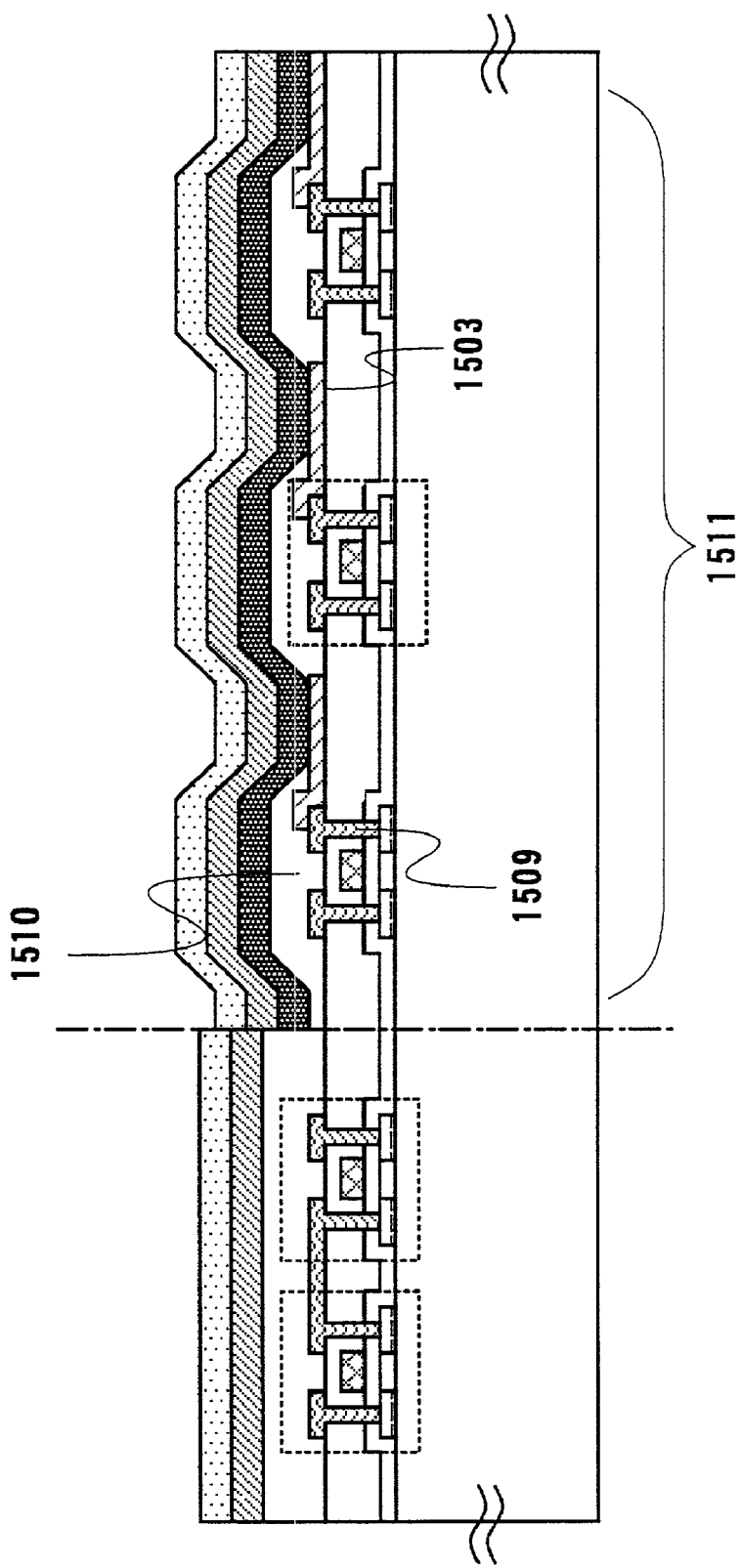
FIG. 15 is a diagram showing a cross sectional structure of a light emitting device.

A light emitting device in which a pixel electrode 1503 is formed after forming a wiring 1509 can also be considered, as shown in FIG. 15. In this case, electric current injection from the pixel electrode 1503 is improved compared to the structure of FIG. 14.

Further, each pixel arranged in the pixel portion 1411 and the pixel portion 1511 is separated by positive taper bank shape structures 1410 and 1510 in FIG. 14 and FIG. 15, respectively. The bank shape structure can also be structured such that the bank shape structure does not contact the pixel electrode by using a reverse taper structure, for example. An example thereof is shown in FIG. 16.

Figure 16:
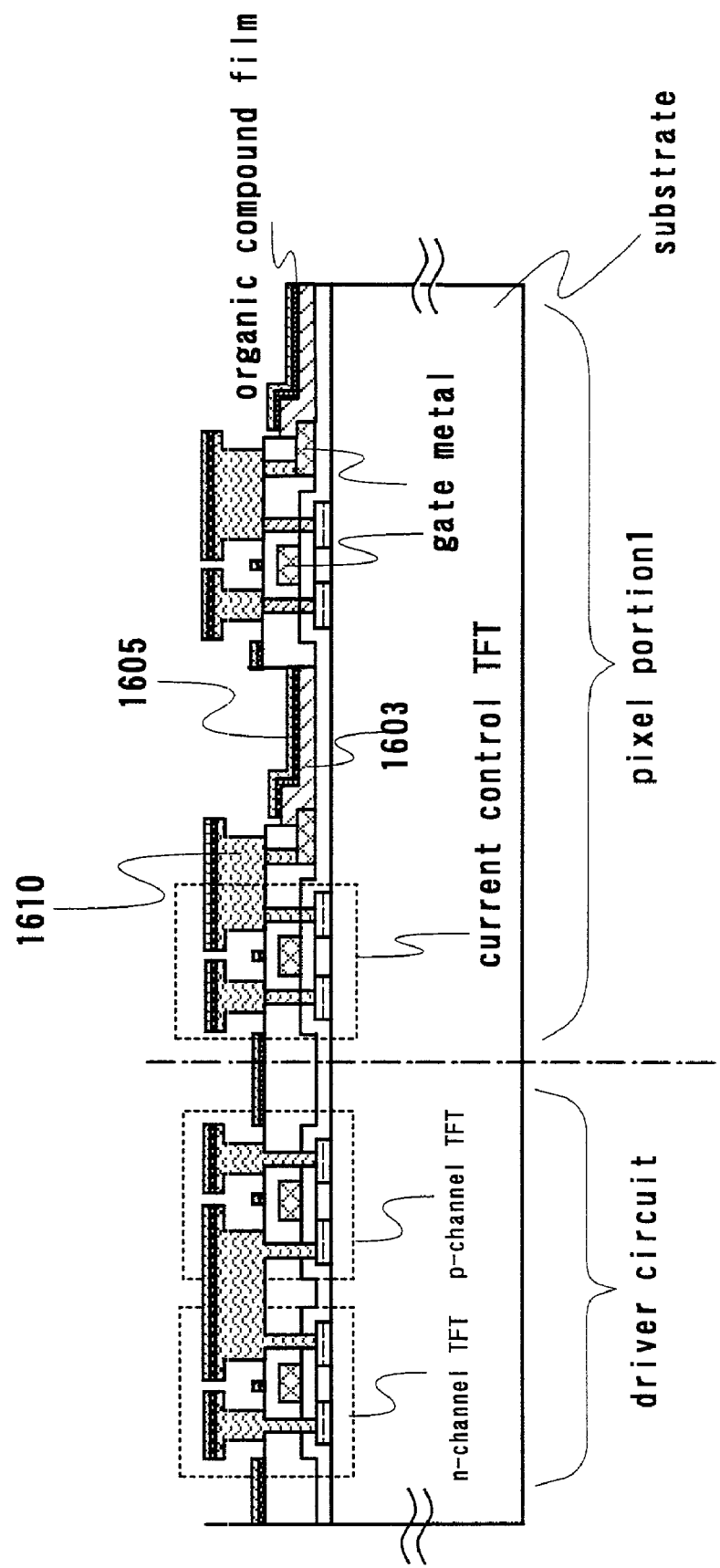
FIG. 16 is a diagram showing a cross sectional structure of a light emitting device.

A wiring and separation portion 1610, serving both as a wiring and a separation portion, is formed in FIG. 16. The shape of the wiring and separation portion 1610 shown in FIG. 16 (a structure having an overhang) can be formed by laminating a metal which composes a wiring, and a material having an etching rate lower than that of the metal (for example, a metal nitride), and then performing etching thereto. Short circuits between a pixel electrode or the wiring, and a cathode 1605, can be prevented due to such a shape. Note that, differing from a normal active matrix light emitting device, a structure in which the cathodes 1605 on the pixels are given a stripe shape (similar to cathodes in passive matrix light emitting device) is shown in FIG. 16.

An external view of the active matrix light emitting device of FIG. 15 is shown in FIGS. 17A and 17B. Note that FIG. 17A shows a top surface diagram, and that a cross sectional diagram in which FIG. 17A is cut along a line P-P' is shown in FIG. 17B. Further, the symbols used in FIG. 15 are also used in FIGS. 17A and 17B.

Reference numeral 1701 in FIG. 17A denotes a pixel portion, reference numeral 1702 denotes a gate signal line driver circuit, and reference numeral 1703 denotes a data signal line driver circuit. Further, signals sent to the gate signal line driver circuit 1702 and to the data signal line driver circuit 1703 are input from a TAB (tape automated bonding) tape 1705, through an input wiring 1704. Note that, although not shown in the figures, a TCP (tape carrier package) in which an IC (integrated circuit) is formed in a TAB tape may be connected instead of the TAB tape 1705.

Reference numeral 1706 denotes a cover material formed above the organic light emitting elements shown in FIG. 15, and the cover material 1706 is bonded using a sealant 1707 made from a resin. Any material may be used for the cover material 1706, provided that oxygen and water cannot pass through the material. As shown in FIG. 17B, a cover made from a plastic material 1706*a*, and having carbon films 1706*b* and 1706*c* (specifically, diamond like carbon films) formed on the obverse and reverse surfaces of the plastic material 1706*a*, is used in Embodiment 3.

In addition, the sealant 1707 is covered by a sealing material 1708 made from a resin, and the organic light emitting elements are completely encapsulated in a closed space 1709 as shown in FIG. 17B. The sealed space 1709 may then be filled with an inert gas (typically nitrogen gas or a noble gas), a resin, or an inert liquid (for example, a liquid state fluorocarbon, typically perfluoroalkane). In addition, it is also effective to form a hygroscopic agent or a deoxidant.

Further, a polarization plate may also be formed in a display surface of the light emitting device (a surface on which images are observed) according to Embodiment 3. The polarization plate suppresses reflection of light made incident from the outside, and is effective in preventing a user's own image from being projected into the display surface. A circular polarization plate is generally used. However, it is preferable to use a structure which gives little internal reflection, by adjusting the index of refraction, in order to prevent light emitted from the organic compound layer from being reflected by the polarization plate and returning to the inside.

Note that any of the organic light emitting elements disclosed by the present invention may be used as the organic light emitting elements contained in the light emitting device of Embodiment 3.

Embodiment 4

An example of a passive matrix light emitting device is shown in Embodiment 4 as an example of a light emitting device containing the organic light emitting elements disclosed by the present invention. A top surface diagram thereof is shown in FIG. 18A, and a cross sectional diagram of FIG. 18A cut along a line P-P' is shown in FIG. 18B.

Figure 18A:
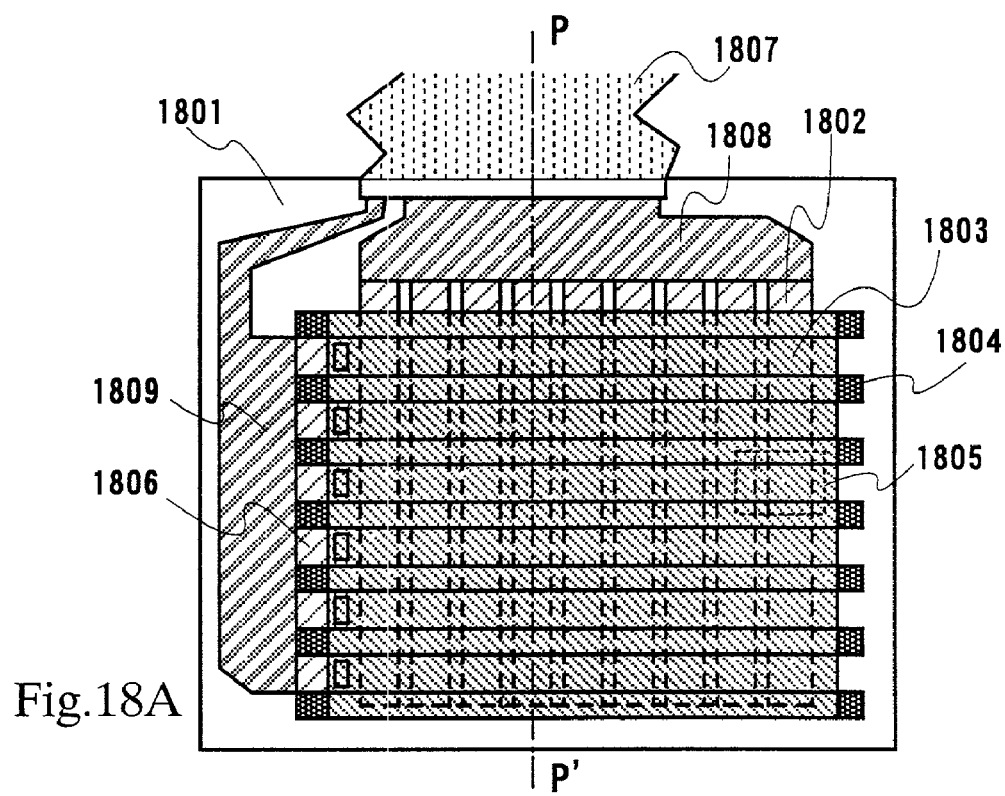
FIGS. 18A to 18C are diagrams showing an upper surface structure and a cross sectional structure, respectively, of a light emitting device.
Figure 18B:
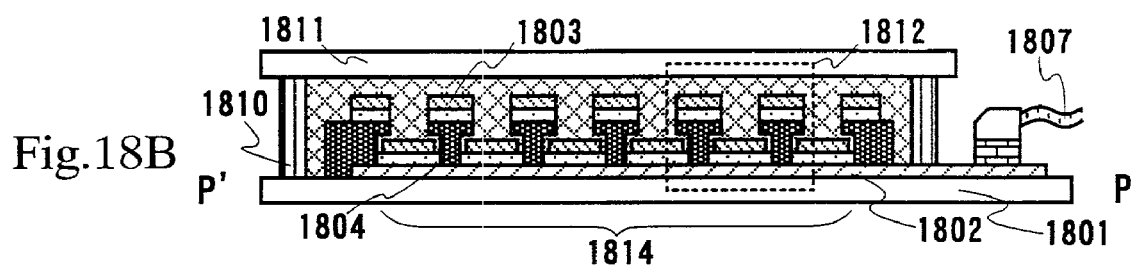

Reference numeral 1801 denotes a substrate in FIG. 18A, and a plastic material is used for the substrate here. Polyimide, polyamide, acrylic resin, epoxy resin, PES (polyethylene sulfile), PC (polycarbonate), PET (polyethylene terephthalate), or PEN (polyethylene naphthalate) can be used in a plate shape, or as a film, as the plastic material.

Reference numeral 1802 denotes a scanning line (anode) made from an oxide conductive film, and an oxide conductive film in which barium oxide is added to zinc oxide is used in Embodiment 4. Further, reference numeral 1803 denotes a data line (cathode made from a metallic film, and a bismuth film is used in Embodiment 4. Reference numeral 1804 denotes a bank made from an acrylic resin, and the banks 1804 function as barriers for separating the data lines 1803. Pluralities of both the scanning lines 1802 and the data lines 1803 are formed in a stripe shape, and the scanning lines 1802 and the data lines 1803 are formed so as to mutually intersect at right angles. Note that, although not shown in the FIG. 18A, organic compound layers are sandwiched between the scanning lines 1802 and the data lines 1803, and intersecting portions 1805 become pixels.

The scanning lines 1802 and the data lines 1803 are connected to an external driver circuit through a TAB tape 1807. Note that reference numeral 1808 denotes a wiring group in which the scanning lines 1802 are aggregated, and that reference numeral 1809 denotes a wiring group in which connection wirings 1806 connected to the data lines 1803 are aggregated. Further, although not shown in the figures, a TCP in which an IC is formed in a TAB tape may also be connected instead of the TAP tape 1807.

Reference numeral 1810 denotes a sealant in FIG. 18B, and reference numeral 1811 denotes a cover material bonded to the plastic substrate 1801 by the sealant 1810. A photo-setting resin may be used as the sealant 1810, and it is preferable to use a material having little outgassing and a low hygroscopicity. It is preferable to use the same material as that of the substrate 1801 for the cover material, and a glass (including quartz glass) or plastic can be used. A plastic material is used here.

Figure 18C:
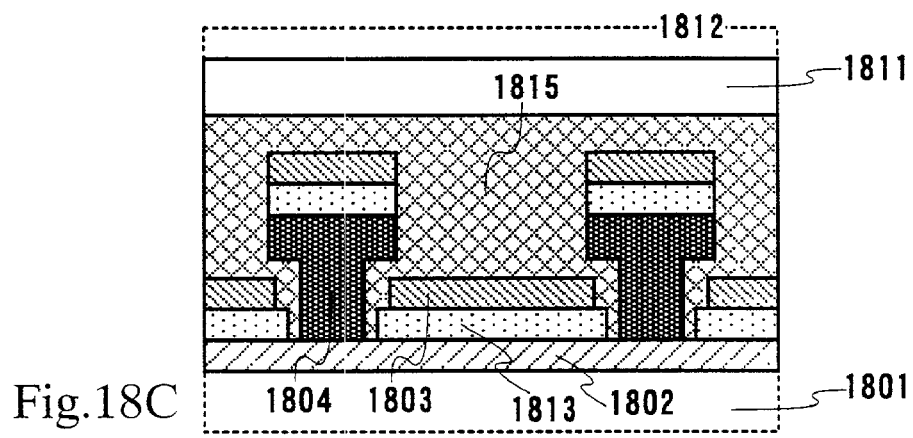

An enlarged diagram of the structure of a pixel region 1812 is shown in FIG. 18C. Reference numeral 1813 denotes an organic compound layer. Note that, as shown in FIG. 18C, the banks 1804 have a shape in which the width of the lower layer is narrower than the width of the upper layer, and physically severs the data lines 1803. Further, a pixel portion 1814 enclosed by the sealant 1810 is cut off from the atmosphere by a sealing material 1814 made from a resin, thus forming a structure in which deterioration of the organic compound layers is prevented.

The pixel portion 1814 is formed by the scanning lines 1802, the data lines 1803, the banks 1804, and the organic compound layer 1813 in light emitting devices of the present invention made from the aforementioned structure, and therefore the manufacturing processes can be made extremely simple.

Further, a polarization plate may also be formed in a display surface (a surface in which an image is observed) of the light emitting device according to Embodiment 4. The polarization plate controls reflection of light made incident from the outside, and is effective in preventing a user's own image from being projected into the display surface. A circular polarization plate is generally used. However, it is preferable to use a structure which gives little internal reflection, by adjusting the index of refraction, in order to prevent light emitted from the organic compound layer from being reflected by the polarization plate and returning to the inside.

Note that any of the organic light emitting elements disclosed by the present invention may be used in the organic light emitting elements contained in the light emitting device of Embodiment 4.

Embodiment 5

In this embodiment, there is a description of an example in which a printed wiring board is provided with the light emitting device shown in the embodiment 4 to form a module.

Figure 19A:
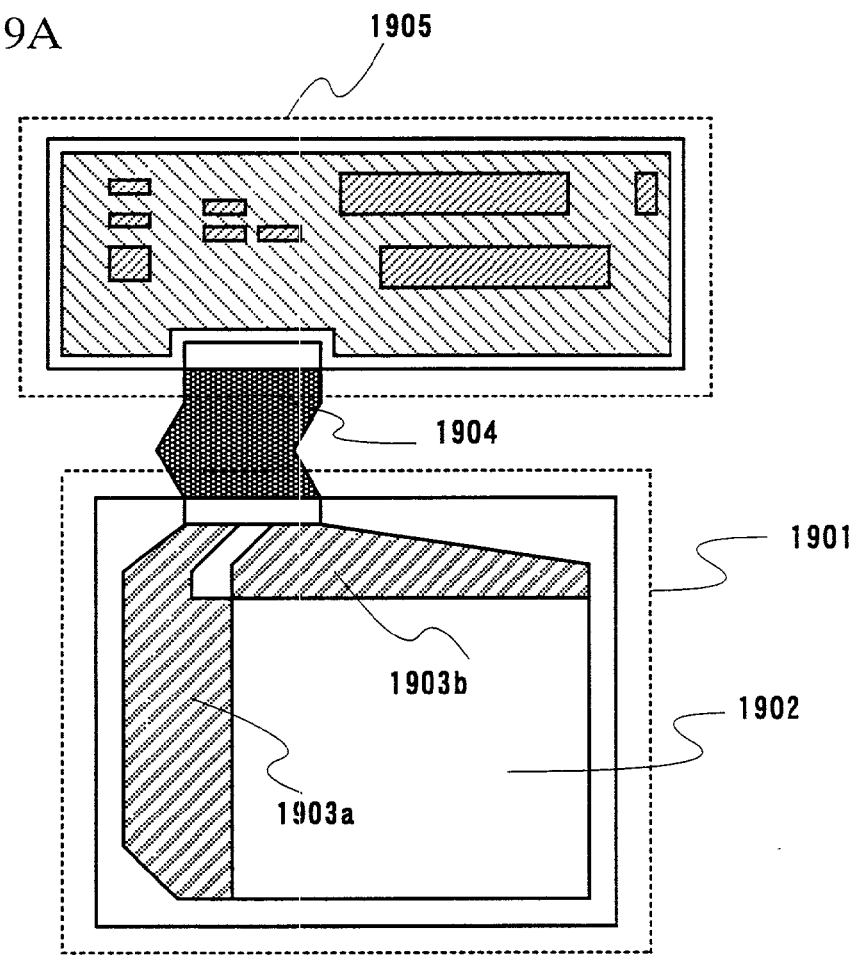
FIG. 19A and 19B are diagrams showing structures of a light emitting device.

In a module shown in FIG. 19A, a TAB tape 1904 is attached to a substrate 1901 (including a pixel portion 1902 and wiring lines 1903*a* and 1903*b*), and a printed wiring board 1905 is attached through the TAB tape 1904.

Figure 19B:
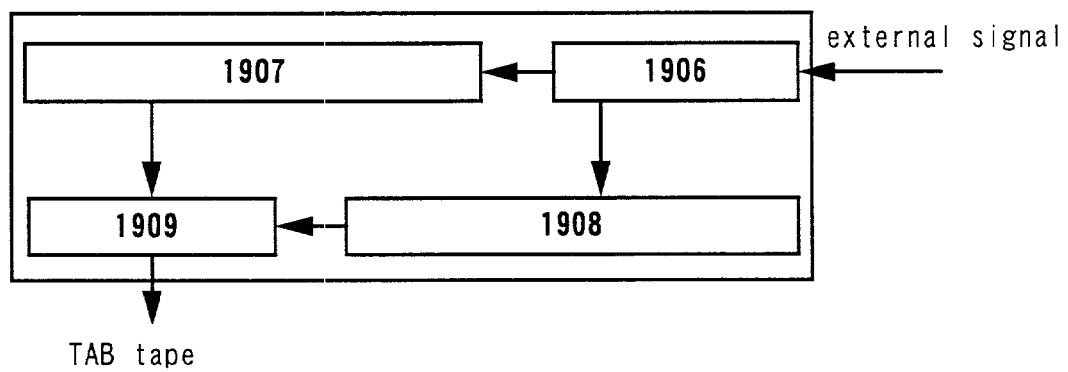

As shown in FIG. 19B, at least I/O ports (also called input or output portion) 1906 and 1909 and an IC functioning as a data signal side driver circuit 1907 and a gate signal side driver circuit 1908 are provided inside the printed wiring board 1905.

The module with the structure, in which the TAB tape is attached to the substrate which has the substrate surface on which the pixel portion is formed and the printed wiring board which has a function as a driver circuit is attached through the TAB tape, is especially called a module with an external driver circuit in the present specification.

Incidentally, as the organic light emitting element included in the light emitting device of this embodiment, any of the organic compounds of the present invention may be used.

Embodiment 6

In this embodiment, a description of an example in which a printed wiring board is provided with the light emitting device shown in the embodiment 3 or the embodiment 4 to form a module.

Figure 20A:
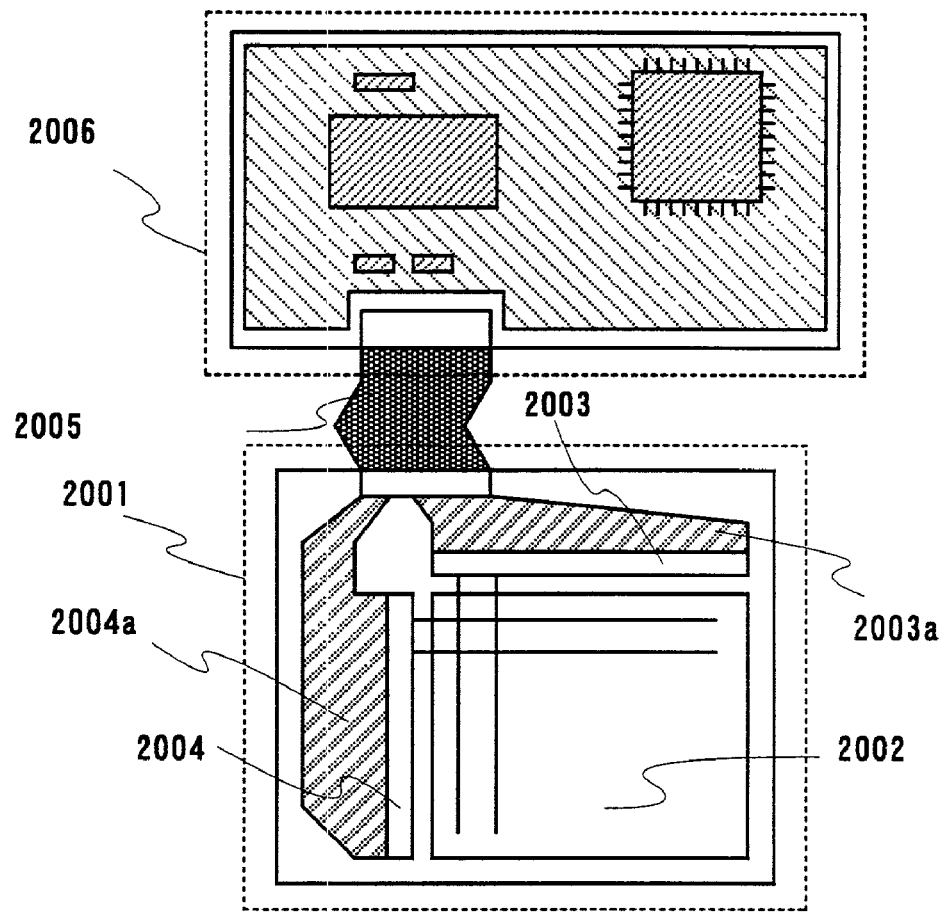
FIGS. 20A and 20B are diagrams showing structures of a light emitting device.

In a module shown in FIG. 20A, a TAB tape 2005 is attached to a substrate 2001 (including a pixel portion 2002, a data signal side driver circuit 2003, a gate signal side driver circuit 2004, and wiring lines 2003a and 2004a) and a printed wiring plate 2006 is attached through the TAB tape 2005. Here, FIG. 20B is a functional block diagram of the printed wiring board 2006.

Figure 20B:
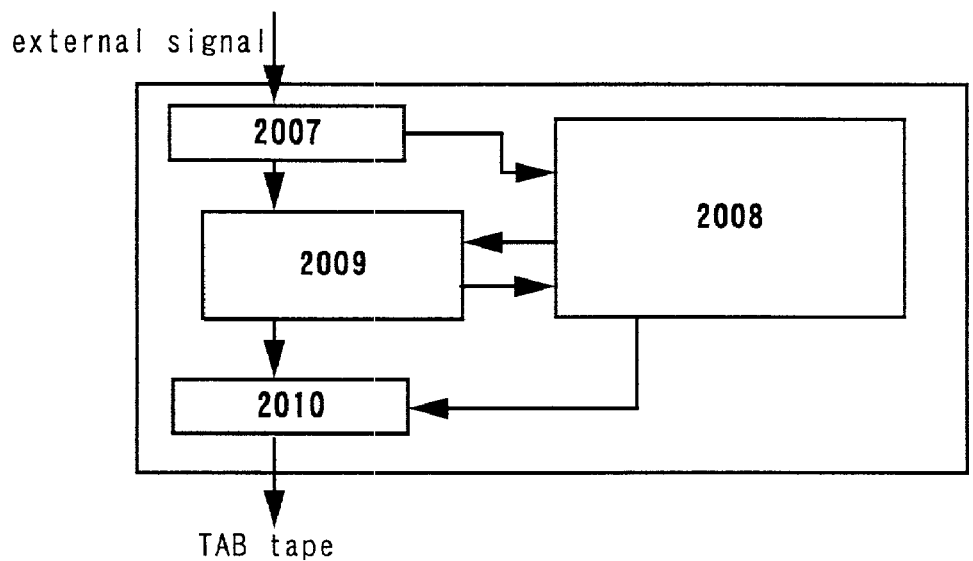

As shown in FIG. 20B, at least I/O ports 2007 and 2010, and an IC functioning as a control portion 2008 are provided inside the printed wiring board 2006. Incidentally, although a memory portion 2009 is provided here, it is not necessarily required. Besides, the control portion 2008 is a portion which has a function to control management of a driver circuit, correction of picture data, and the like.

The module of the structure, in which the printed wiring board with the function as a controller is attached to the substrate over which the organic light emitting element is formed, is especially called a module with an external controller in the present specification.

Incidentally, as the organic light emitting element included in the light emitting device of this embodiment, any of the organic compounds of the present invention may be used.

Embodiment 7

An example of a light emitting device in which triplet light emitting elements like those shown by Embodiment 2 are driven by a digital time gray scale display is shown in Embodiment 7. The light emitting device of Embodiment 7 is extremely useful because high efficiency light emission can be achieved by utilizing light emitted from a triplet excitation state, and at the same time a uniform image can be obtained by employing digital time gray scale display.

In addition to the material constitution of the organic compound film discussed in Embodiment 2, a constitution in which the hole injecting compound CuPc is evaporated on an anode before evaporation of α-NPD and subsequent materials, in order, as disclosed by the present invention, may also be used in the organic light emitting element structure. The organic compound film is then formed subsequently by the method shown in Embodiment 2.

Figure 21A:
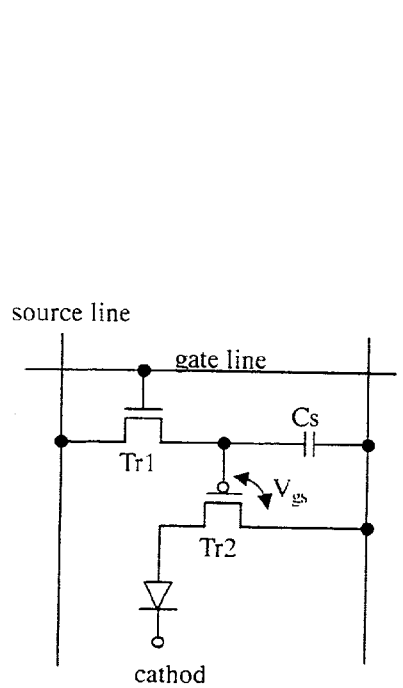
FIGS. 21A to 21C are diagrams showing structures of a light emitting device.

A circuit structure of a pixel used in the organic light emitting element is shown in FIG. 21A. Reference symbols Tr1 and Tr2 denote transistors, and reference symbol Cs denotes a storage capacitor. An electric current flows from a source line to the transistor Tr1 in this circuit if a gate line is selected, and a voltage corresponding to that signal is stored in the storage capacitor Cs. An electric current controlled by a voltage Vgs between a gate and a source of the transistor Tr2 then flows in the transistor Tr2 and in the organic light emitting element.

The transistor Tr1 is placed in an off state after Tr1 has been selected, and the voltage Vgs of the storage capacitor Cs is stored. The electric current depending only upon the voltage Vgs can therefore continue to flow.

Figure 21B:
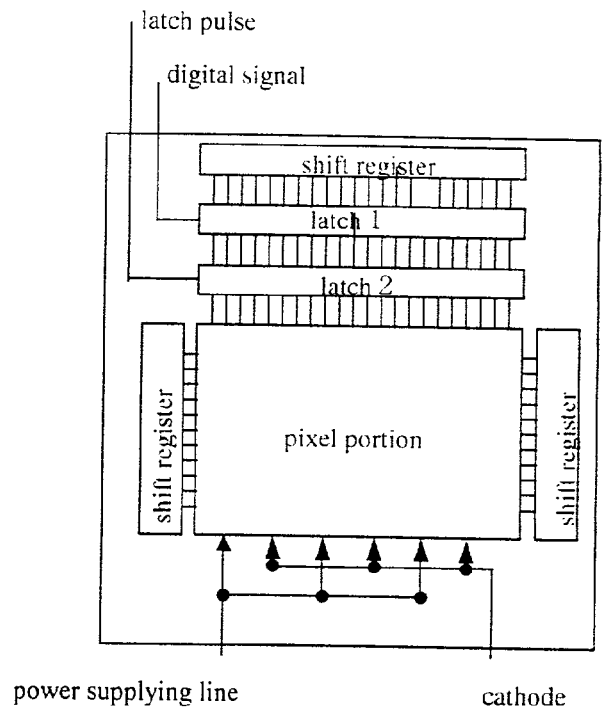

A chart for showing driver this type of circuit by digital time gray scale display is shown in FIG. 21B. One frame is divided into a plurality of sub-frames, and 6 bit gray scale is shown in FIG. 21B with one frame divided into 6 sub-frames (SF1 to SF6). The ratio of light emitting periods for each of the sub-frames becomes 32::16::8::4::2::1 in this case.

Figure 21C:
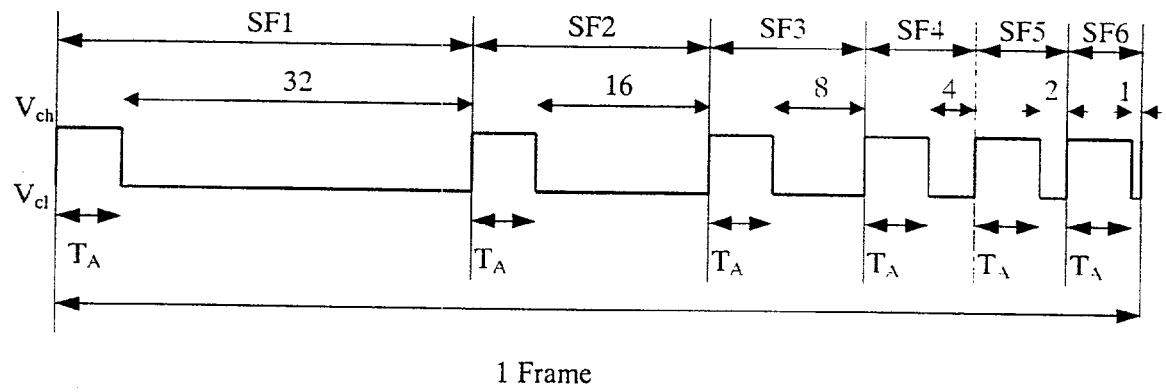

The concept of a driver circuit of the TFT substrate in Embodiment 7 is shown in FIG. 21C. A gate driver and a source driver are formed on the same substrate. A pixel circuit and a driver are set so as to perform digital drive, and therefore a uniform image can be obtained that is not influenced by dispersion in the TFT properties.

Embodiment 8

The light emitting device of the present invention, which is described in the above embodiment has advantages being bright and having low consumption power. Thus, electric equipment including the light emitting device as a display device or the like can be operated with lower consumption power than a conventional appliance. In particular, electric equipment such as a mobile equipment in which a battery is used as a power source is extremely effective. Because the low consumption power directly leads convenience (no battery state is hard to cause).

Since the light emitting device is a self light emission type, a back light in a liquid crystal display device is not required. Also, since a thickness of the organic compound film does not exceed 1 μm, thinness and weight reduction are allowed. Thus, electric equipment including the light emitting device as a display device or the like is thinner and light in weight as compared with a conventional appliance. In particular, electric equipment such as a mobile equipment is extremely effective, because thinness and light in weight directly leads convenience (light and compact in portage). Further, with respect to electric equipment in general, there is no room for doubt that thinness (not bulk) is effective in view of transportation (mass transportation is allowed) and setting (saving of a space such as a room).

Also, since the light emitting device is a self light emission type, this light emitting device has higher visibility in a light place and a wider view angle, as compared with those of a liquid crystal display device. Therefore, an electric equipment including the light emitting device as a display portion has a large merit in view of display visibility.

To summarize, electric equipments that use a light emitting device of the present invention have, in addition to merits of conventional organic light emitting elements, namely, thinness/lightness and high visibility, new features of low power consumption and long lifetime, and therefore are very useful.

In this embodiment, an example of electric equipment including the light emitting device of the present invention as a display portion will be described. Concrete examples are shown in FIGS. 22A to 22F and 23A and 23B. As the organic light emitting element included in the electric equipment of this embodiment, any one of the structures shown in the present invention may be used. Also, as a mode of the light emitting device included in the electric equipment of this embodiment, any one of the modes shown in FIGS. 14 to 21A and 21B may be used.

Figure 22A:
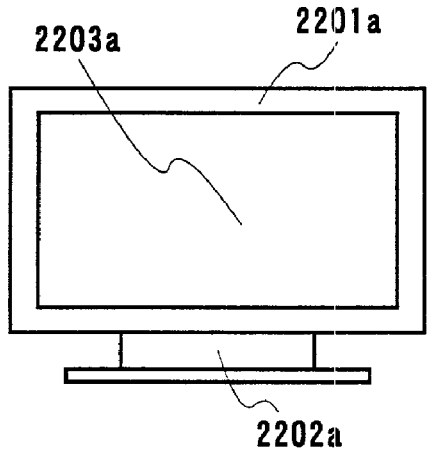
FIGS. 22A to 22F are diagrams showing specific examples of electronic equipment.

FIG. 22A shows a display device using an organic compound element including a casing 2201a, a support base 2202a, and a display portion 2203a. When a display in which the light emitting device of the present invention is used as the display portion 2203a is manufactured, a thin and lightweight display can be realized. Thus, transportation is easy and space saving at setting the display is allowed.

Figure 22B:
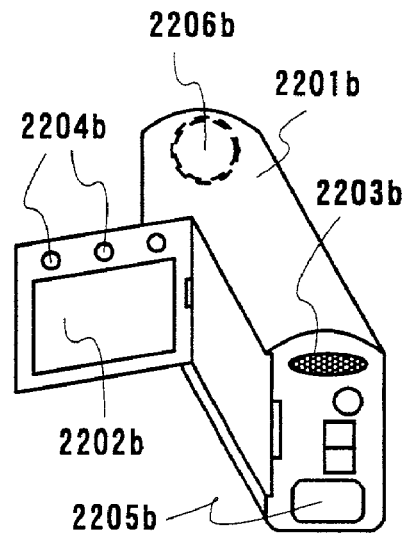

FIG. 22B shows a video camera including a main body 2201b, a display portion 2202b, a voice input portion 2203b, an operational switch 2204b, a battery 2205b, and an image receiving portion 2206b. When a video camera using the light emitting device of the present invention as the display portion 2202b is manufactured, a video camera having low consumption power and being lightweight can be realized. Thus, consumption of a battery is reduced and portage becomes easy.

Figure 22C:
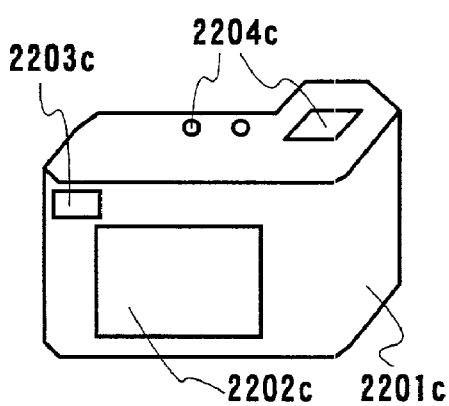

FIG. 22C shows a digital camera including a main body 2201c, a display portion 220c, an eyepiece portion 2203c, and an operational switch 2204c. When a digital camera using the light emitting device of the present invention as the display portion 2202c is manufactured, a digital camera having low consumption power and being lightweight can be realized. Thus, consumption of a battery is reduced and portage becomes easy.

Figure 22D:
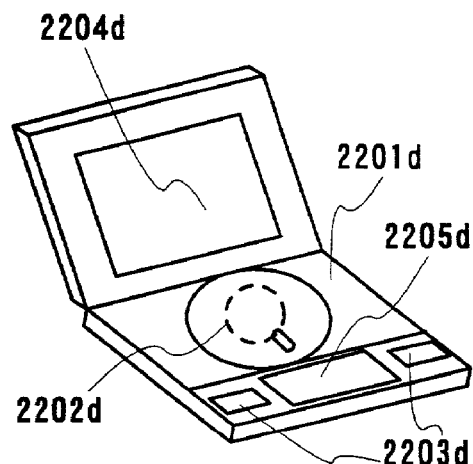

FIG. 22D shows an image reproduction apparatus having a recording medium. The image reproduction apparatus includes a main body 2201d, a recording medium (CD, LD, DVD, or the like) 2202d, an operational switch 2203d, a display portion (A) 2204d, and a display portion (B) 2205d. The display portion (A) 2204d displays mainly image information and the display portion (B) 2205d displays mainly character information. When the image reproduction apparatus using the light emitting device of the present invention as these display portions (A) 2204d and (B) 2205d is manufactured, an image reproduction apparatus having low consumption power and being lightweight can be realized. The image reproduction apparatus having the recording medium includes a CD reproduction apparatus, a game equipment, and the like.

Figure 22E:
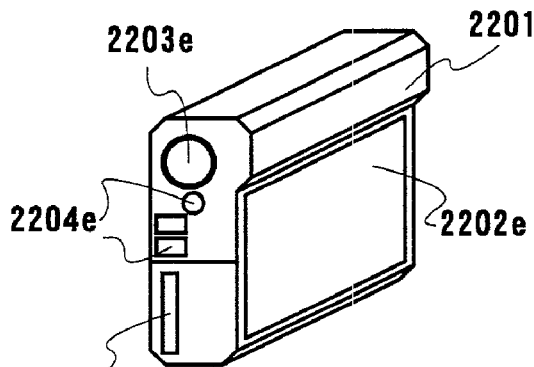

FIG. 22E shows a portable (mobile) computer including a main body 2201e, a display portion 2202e, an image receiving portion 2203e, an operational switch 2204e, and a memory slot 2205e. When a portable computer using the light emitting device of the present invention as the display portion 2202e is manufactured, a portable computer having low consumption power, being thin, and lightweight can be realized. Thus, consumption of a battery is reduced and portage becomes easy. This portable computer can record information in a recording medium into which a flash memory and a non-volatile memory are integrated and reproduce the information.

Figure 22F:
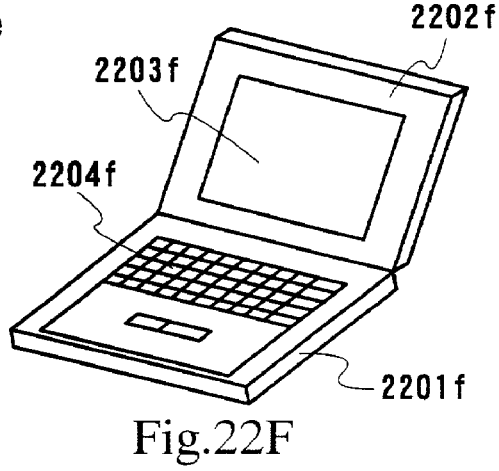

FIG. 22F shows a personal computer including a main body 2201f, a casing 2202f, a display portion 2203f, and a keyboard 2204f. When a personal computer using the light emitting device of the present invention as the display portion 2203f is manufactured, a personal computer having low consumption power, being thin, and lightweight can be realized. In particular, when portage use is required as the case of a note personal computer, it is a large merit in view of consumption of a battery and lightness.

In many cases, the above electric equipment displays information distributed through an electronic communication line such as Internet and a radio communication such as radio wave. In particular, the case where moving image information is displayed is increased. A response speed of the organic light emitting material is very high, and thus it is suitable for such moving image display.

Figure 23A:
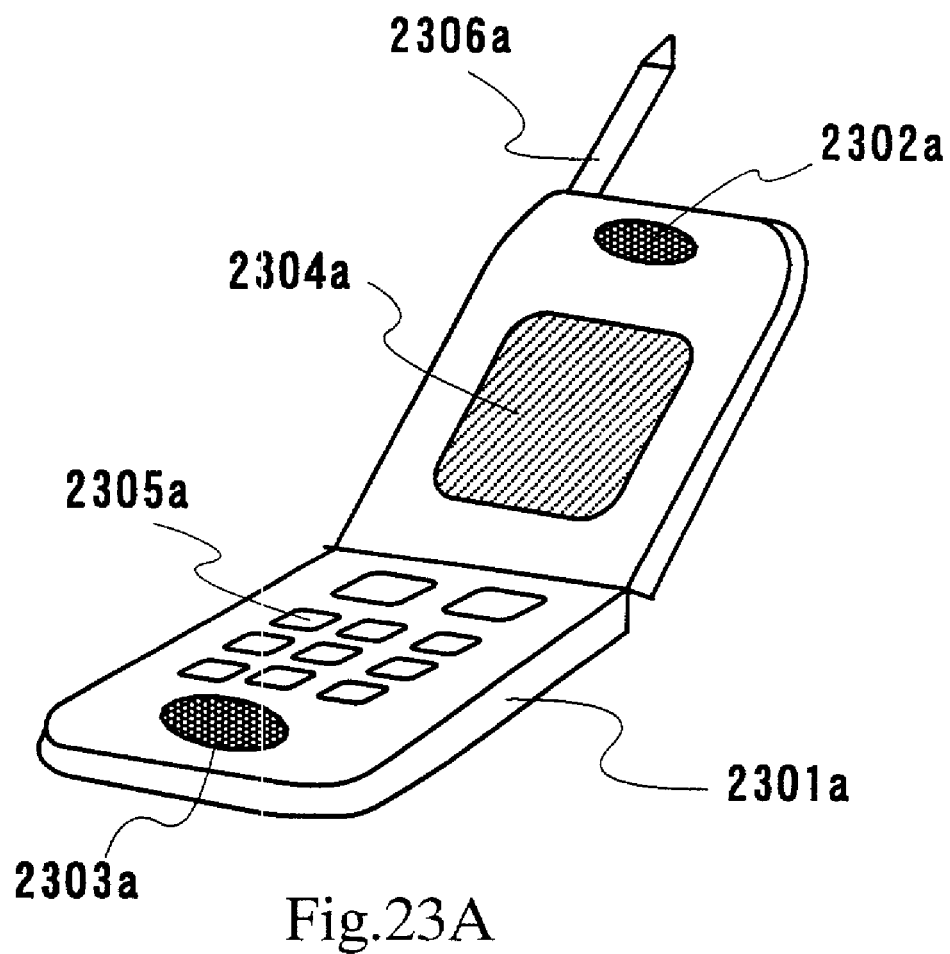
FIGS. 23A and 23B are diagrams showing specific examples of electronic equipment.

Next, FIG. 23A shows a mobile telephone including a main body 2301a, a voice output portion 2302a, a voice input portion 2303a, a display portion 2304a, an operational switch 2305a, and an antenna 2306a. When a mobile telephone using the light emitting device of the present invention as the display portion 2304a is manufactured, a mobile telephone having low consumption power, being thin, and lightweight can be realized. Thus, consumption of a battery is reduced, portage becomes easy, and the main body can be made compact.

Figure 23B:
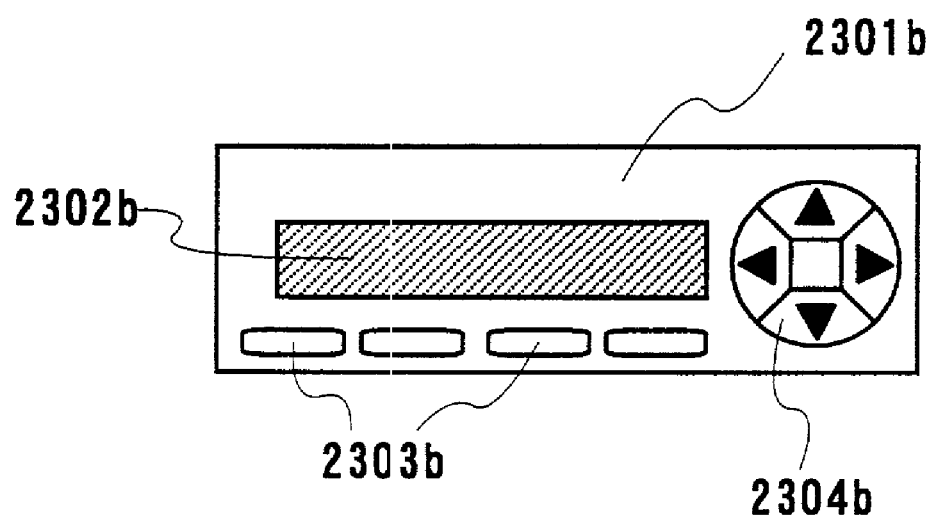

FIG. 23B shows an acoustic equipment (concretely, a vehicle setting audio) including a main body 2301b, a display portion 2302b, and operational switches 2303b and 2304b. When an acoustic equipment using the light emitting device of the present invention as the display portion 2302b is manufactured, an acoustic equipment having low consumption power and being light in weight can be realized. However, in this embodiment, the vehicle setting audio is described as an example. The light emitting device may be used for a home audio.

With respect to the electric equipment as shown in FIGS. 22A to 22F and 23A and 23B, it is effective that a photo sensor is incorporated and a means for detecting brightness in an environment for use is provided and thus a function such as a light emission intensity is modulated in accordance with the brightness in the environment for use is provided. If the intensity with a contrast ratio of 100 to 150 can be obtained as compared with the brightness in the environment for use, a user can recognize an image or character information without causing a problem. That is, when the environment for use is light, the intensity of the image can be increased such that it is easy to view. On the other hand, when the environment for use is dark, the intensity of the image can be reduced and thus consumption power can be suppressed.

Also, since an operation with low consumption power, thinness, and weight reduction are allowed, various electric equipment using the light emitting device of the present invention as a light source are very useful. Typically, with respect to electric equipment including the light emitting device of the present invention as a light source such as a back light or a front light of the liquid crystal display device or a light source of an illumination equipment, realization of low consumption power, thinness, and weight reduction is allowed.

Thus, even in the case where a liquid crystal display is used for all the display portions of the electric equipment which are described in this embodiment and shown in FIGS. 22A to 22F and 23A and 23B, when electric equipment using the light emitting device of the present invention as the back light or the front light of the liquid crystal display is manufactured, electric equipment having low consumption power, being thin, and light in weight can be achieved.

A light emitting device having low electric power consumption and a superior lifetime can be obtained by implementing the present invention. In addition, electronic equipment having low electric power consumption and a long lifetime can be obtained by using this type of light emitting device as a light source or in a display portion.

What is claimed is:

1. A light emitting, device comprising an organic light emitting element comprising:
   an anode;
   a cathode; and
   an organic compound film sandwiched between the anode and the cathode,
   wherein the organic compound film comprises:
     a first layer comprising a first compound;
     a second layer comprising the first compound and a second compound; and
     a third layer comprising the second compound,
     wherein the first compound is a blocking compound capable of stopping the movement of holes or electrons, and
     wherein the second compound is at least one selected compound selected from the group consisting of:
     a hole injecting compound that receives holes from the anode;
     a hole transporting compound that has a hole mobility that is larger than its electron mobility;
     an electron transporting compound that has an electron mobility that is larger than is hole mobility; and
     an electron injecting compound that receives electrons from the cathode,
   wherein the blocking compound and the at least one compound selected are materials capable of undergoing vacuum evaporation, and
   wherein the electric current versus electric voltage property of the organic light emitting elements show a rectification property.

2. A light emitting device according to claim 1, wherein the blocking compound and the at least one selected compound are hosts, and a guest is added to the region.

3. A light emitting device according to claim 2, wherein the guest is a light emitting compound for emitting light.

4. A light emitting device according to claim 1, wherein the light emitting device is included with electrical equipment selected from the group consisting of: a display, a video camera, a digital camera, an image reproduction apparatus, a portable computer, a personal computer, a mobile telephone, and an acoustic equipment.

5. A light emitting device comprising an organic light emitting element comprising:
   an anode;
   a cathode; and
   an organic compound film sandwiched between the anode and the cathode,
   wherein the organic compound film comprises a hole injecting compound that receives holes from the anode and a hole transporting compound that has a hole mobility that is larger than its electron mobility;
   wherein the hole injecting compound and the hole transporting compound are materials capable of undergoing vacuum evaporation,
   wherein the organic compound film comprises a region in which the hole injecting compound and the hole transporting compound are mixed,
   wherein the electric current versus electric voltage property of the organic light emitting elements show a rectification property, and
   wherein a concentration of the hole injection compound decreases continuously from the anode to the cathode.

6. A light emitting device according to claim 5, wherein the hole injecting compound and the hole transporting compound are hosts, and a guest is added to the region.

7. A light emitting device according to claim 6, wherein the guest is a light emitting compound for emitting light.

8. A light emitting device according to claim 5, wherein the light emitting device is included with electrical equipment selected from the group consisting of: a display, a video camera, a digital camera, so image reproduction apparatus, a portable computer, a personal computer, a mobile telephone, and an acoustic equipment.

9. A light emitting device comprising an organic light emitting element comprising:
   an anode;
   a cathode; and
   an organic compound film sandwiched between the anode and the cathode,
   wherein the organic compound film an electron transporting compound that has an electron mobility that is larger than its hole mobility and an electron injecting compound that receives electrons from the cathode,
   wherein the electron transporting compound and the electron injecting compound are materials capable of undergoing vacuum evaporation,
   wherein the organic compound film comprises a region in which the electron transporting compound and the electron injecting compound are mixed, and
   wherein the electric current versus electric voltage property of the organic light emitting elements show a rectification property.

10. A light emitting device according to claim 9, wherein the electron injecting compound and the electron transporting compound are hosts, and a guest is added to the region.

11. A light emitting device according to claim 10, wherein the guest is a light emitting compound for emitting light.

12. A light emitting device according to claim 9, wherein the light emitting device is included with electrical equipment selected from the group consisting of: a display, a video camera, a digital camera, an image reproduction apparatus, a portable computer, a personal computer, a mobile telephone, and an acoustic equipment.

13. A light emitting device comprising an organic light emitting element comprising:
   an anode;
   a cathode; and
   an organic compound film sandwiched between the anode and the cathode,
   wherein the organic compound film comprises:
     a first layer comprising a first compound;
     a second layer comprising the first compound and a second compound; and
     a third layer comprising the second compound,
     wherein first compound is a blocking compound capable of stopping the movement of holes or electrons, and
     wherein the second at least one selected compound selected from the group consisting of:
     a hole injecting compound that receives holes from the anode;
     an electron transporting compound that has an electron mobility that is larger than its hole mobility; and
     an electron injecting compound that receives electrons from the cathode,
   wherein the blocking compound and the at least one selected compound are materials capable of undergoing vacuum evaporation, and
   wherein a concentration change of the first and second compound in the second layer is continuous.

14. A light emitting device according to claim 13, wherein the blocking compound and the at least one selected compound are hosts, and a guest is added to the region.

15. A light emitting device according to claim 14, wherein the guest is a light emitting compound for emitting light.

16. A light emitting device according to claim 13, wherein the light emitting device is included with electrical equipment selected from the group consisting of: a display, a video camera, a digital camera, an image reproduction apparatus, a portable computer, a personal computer, a mobile telephone, and an acoustic equipment.

17. A light emitting device comprising an organic light emitting element comprising:

an anode;

a cathode; and an organic compound film sandwiched between the anode and the cathode, wherein the organic compound film a hole injecting compound that receives holes from the anode and a hole transporting compound that has a hole mobility that is larger than its electron mobility, wherein the hole injecting compound and the hole transporting compound are materials capable of undergoing vacuum evaporation, wherein the organic compound film comprises a region in which the hole injecting compound and the hole transporting compound are mixed, and wherein a concentration or the hole injection compound decreases continuously from the anode to the cathode.

18. A light emitting device according to claim 17, wherein the hole injecting compound and the hole transporting compound are hosts, and a guest is added to the region.

19. A light emitting device according to claim 18, wherein the guest is a light emitting compound for emitting light.

20. A light emitting device according to claim 17, wherein the light emitting device is included with electrical equipment selected from the group consisting of: a display, a video camera, a digital camera, an image reproduction apparatus, a portable computer, a personal computer, a mobile telephone, and an acoustic equipment.

21. A light emitting device comprising an organic light emitting element comprising:

an anode;

a cathode; and an organic compound film sandwiched between the anode and the cathode, wherein the organic compound film an electron transporting compound that has an electron mobility that is larger than its hole mobility and an electron injecting compound that receives electrons from the cathode, wherein the electron transporting compound and the electron injecting compound are materials capable of undergoing vacuum evaporation, and wherein the organic compound film comprises a region in which the electron transporting compound and electron injecting compound are mixed.

22. A light emitting device according to claim 21, wherein the electron injecting compound and the electron transporting compound are hosts, and a guest is added to the region.

23. A light emitting device according to claim 22, wherein the guest is a light emitting compound for emitting light.

24. A light emitting device according to claim 21, wherein the light emitting device is included with electrical equipment selected from the group consisting of: a display, a video camera, a digital camera, an image reproduction apparatus, a portable computer, a personal computer, a mobile telephone, and an acoustic equipment.

* * * * *